US 12,555,755 B2

(12) United States Patent
Jo et al.

(10) Patent No.: US 12,555,755 B2
(45) Date of Patent: *Feb. 17, 2026

(54) BATCH TYPE SUBSTRATE PROCESSING APPARATUS

(71) Applicant: EUGENE TECHNOLOGY CO., LTD., Yongin-Si (KR)

(72) Inventors: Jeong Hee Jo, Yongin-si (KR); Chang Dol Kim, Yongin-si (KR)

(73) Assignee: EUGENE TECHNOLOGY CO., LTD. (KR)

( * ) Notice: Subject to any disclaimer, the term of this patent is extended or adjusted under 35 U.S.C. 154(b) by 407 days.

This patent is subject to a terminal disclaimer.

(21) Appl. No.: 18/116,840

(22) Filed: Mar. 2, 2023

(65) Prior Publication Data
US 2023/0282459 A1  Sep. 7, 2023

(30) Foreign Application Priority Data
Mar. 4, 2022  (KR) .......... 10-2022-0028149

(51) Int. Cl.
*H01J 37/32* (2006.01)

(52) U.S. Cl.
CPC .. *H01J 37/32779* (2013.01); *H01J 37/32091* (2013.01); *H01J 37/3244* (2013.01);
(Continued)

(58) Field of Classification Search
None
See application file for complete search history.

(56) References Cited

U.S. PATENT DOCUMENTS

| 5,383,984 A * | 1/1995 | Shimada ........... H01L 21/67109 156/345.43 |
| 2010/0015811 A1* | 1/2010 | Sato .................... H01L 21/0228 438/758 |

(Continued)

FOREIGN PATENT DOCUMENTS

| JP | 2004134465 A * | 4/2004 |
| JP | 2004186534 A | 7/2004 |

(Continued)

OTHER PUBLICATIONS

English Machine translation of Kagaya (JP2004134465A) retrieved from Espacenet Jun. 9, 2025 (Year: 2025).*

*Primary Examiner* — Ram N Kackar
*Assistant Examiner* — Laureen Chan
(74) *Attorney, Agent, or Firm* — Renaissance IP Law Group LLP

(57) ABSTRACT

Provided is a batch type substrate processing apparatus that generates plasma by a plurality of electrodes to perform a processing process on a substrate. The batch type substrate processing apparatus includes a reaction tube, a plurality of electrodes, and an electrode protection part. The plurality of electrodes includes first and second power supply electrodes spaced apart from each other and first and second ground electrodes provided between the first power supply electrode and the second power supply electrode to correspond to the first power supply electrode and the second power supply electrode, respectively. The electrode protection part includes a plurality of first electrode protection tubes which have inner spaces in which the first and second power supply electrodes are inserted, respectively, a plurality of second electrode protection tubes which have inner spaces in which the first and second ground electrodes are inserted, respectively, and a plurality of bridge parts configured to connect (Continued)

upper ends of the first electrode protection tube and the second electrode protection tube, which face each other, to each other, respectively.

9 Claims, 3 Drawing Sheets

(52) U.S. Cl.
CPC .. *H01J 37/32559* (2013.01); *H01J 37/32568* (2013.01); *H01J 2237/002* (2013.01); *H01J 2237/332* (2013.01)

(56) References Cited

U.S. PATENT DOCUMENTS

| | | | | |
|---|---|---|---|---|
| 2012/0100722 | A1* | 4/2012 | Asai | H01L 21/0337 |
| | | | | 438/758 |
| 2018/0182601 | A1* | 6/2018 | Takeda | C23C 16/505 |
| 2019/0085456 | A1 | 3/2019 | Jo et al. | |
| 2019/0108985 | A1* | 4/2019 | Kang | H01J 37/32559 |

FOREIGN PATENT DOCUMENTS

| | | | |
|---|---|---|---|
| JP | 2010010570 | A | 1/2010 |
| JP | 2012094652 | A | 5/2012 |
| KR | 101145538 | B1 | 5/2012 |
| KR | 102139296 | B1 | 7/2020 |
| KR | 20210136488 | A | 11/2021 |
| KR | 102354879 | B1 | 2/2022 |
| KR | 20230130930 | A | 9/2023 |
| TW | 201222637 | A | 6/2012 |
| TW | 201448038 | A | 12/2014 |
| TW | 202118894 | A | 5/2021 |

\* cited by examiner (a)

(b)

BATCH TYPE SUBSTRATE PROCESSING APPARATUS

CROSS-REFERENCE TO RELATED APPLICATION

This application claims priority to Korean Patent Application No. 10-2022-0028149 filed on Mar. 4, 2022, and all the benefits accruing therefrom under 35 U.S.C. § 119, the contents of which are incorporated by reference in their entirety.

BACKGROUND

The present disclosure relates to a batch type substrate processing apparatus, and more particularly, to a batch type substrate processing apparatus that generates plasma by a plurality of electrodes to perform a processing process on a substrate.

In general, a substrate processing apparatus that locates a substrate to be processed within a processing space to deposit reaction particles contained in a process gas injected into the processing space by using chemical vapor deposition (CVD) or atomic layer deposition (ALD). The substrate processing apparatus is classified into a single wafer type substrate processing apparatus, which is capable of performing a processing process on one substrate, and a batch type substrate processing apparatus, which is capable of performing a processing process on a plurality of substrates at the same time.

The batch type substrate processing apparatus may supply high frequency power to a plurality of electrodes to generate plasma and thus supplies radicals, which are obtained by exciting a process gas injected around a plurality of electrodes, to a substrate to perform a processing process. Here, the plurality of electrodes may be damaged while ions generated by the plasma are accelerated toward the plurality of electrodes to collide with the plurality of electrodes.

In addition, while high frequency power may be supplied to the plurality of electrodes to generate plasma, and thus, heat is generated in the plurality of electrodes. As a temperature of the plurality of electrodes increases due to the heat generation, resistance of the plurality of electrodes increases, so that a voltage of the plurality of electrodes increases, and thus, energy of ions generated by the plasma increases. In addition, the plurality of electrodes may be further damaged while ions having high energy strongly collide with the plurality of electrodes. Particularly, when a processing space is heated by a hot wall type heating unit (or heater) surrounding the processing space, a temperature of the plurality of electrodes further increases, which becomes more problematic issue.

Thus, there is a demand for a configuration capable of lowering temperatures of a plurality of electrodes and ambient temperatures of the electrodes while preventing damage to the plurality of electrodes.

PRIOR ART DOCUMENT

Patent Document

Korean Patent No. 10-1145538

SUMMARY

The present disclosure provides a batch type substrate processing apparatus that protects a plurality of electrodes for plasma formation through an electrode protection part.

In accordance with an exemplary embodiment, a batch type substrate processing apparatus includes: a reaction tube configured to provide a processing space in which a plurality of substrates are accommodated; a plurality of electrodes extending in a longitudinal direction of the reaction tube and disposed along a circumferential direction of the reaction tube; and an electrode protection part configured to protect the plurality of electrodes, wherein the plurality of electrodes includes: first and second power supply electrodes spaced apart from each other; and first and second ground electrodes provided between the first power supply electrode and the second power supply electrode to correspond to the first power supply electrode and the second power supply electrode, respectively, and the electrode protection part includes: a plurality of first electrode protection tubes, each of which has a closed upper end and an opened lower end, and which have inner spaces in which the first and second power supply electrodes are inserted, respectively; a plurality of second electrode protection tubes, each of which has a closed upper end and an opened lower end, and which have inner spaces in which the first and second ground electrodes are inserted, respectively; and a plurality of bridge parts configured to connect upper ends of the first electrode protection tube and the second electrode protection tube, which face each other, to each other, respectively.

The first ground electrode may be spaced apart from the first power supply electrode, the second ground electrode may be spaced apart from the second power supply electrode, and the plurality of electrodes may be configured to generate capacitively coupled plasma (CCP) in a spaced space between the first power supply electrode and the first ground electrode and a spaced space between the second power supply electrode and the second ground electrode.

The first and second ground electrodes may be spaced apart from each other.

A spaced distance between the first and second ground electrodes may be less than or equal to each of a spaced distance between the first power supply electrode and the first ground electrode and a spaced distance between the second power supply electrode and the second ground electrode.

The first electrode protection tube and the second electrode protection tube, which face each other, may be connected to each other by the bridge parts to communicate with each other, wherein the batch type substrate processing apparatus may further include: a cooling gas supply part configured to supply a cooling gas into the first electrode protection tube and the second electrode protection tube, which face each other; and a cooling gas discharge part configured to discharge the cooling gas from the first electrode protection tube and the second electrode protection tube, which face each other, so as to generate a flow of the cooling gas.

The cooling gas supply part may be connected to each of the plurality of second electrode protection tubes, and the cooling gas discharge part may be connected to each of the plurality of first electrode protection tubes.

The batch type substrate processing apparatus may further include: a gas supply sealing cap which is connected to any one electrode protection tube of the first electrode protection tube and the second electrode protection tube, which face each other, and in which an inflow port through which the cooling gas is supplied is provided in a sidewall of an inner space communicating with the any one electrode protection tube; and a gas discharge sealing cap which is connected to the other electrode protection tube of the first electrode protection tube and the second electrode protection tube, which face each other, and in which an exhaust port through which the cooling gas is discharged is provided in a sidewall of an inner space communicating with the other electrode protection tube.

The cooling gas may include an inert gas.

The batch type substrate processing apparatus may further include: a high frequency power source part configured to supply high frequency power; and a power distribution part provided between the high frequency power source part and the first and second power supply electrodes and configured to distribute the high frequency power supplied from the high frequency power source part so as to provide the distributed high frequency power to each of the first and second power supply electrodes.

The power distribution part may include a variable capacitor provided between a distribution point, at which the high frequency power is distributed to each of the first and second power supply electrodes, and at least one of the first and second power supply electrodes.

The batch type substrate processing apparatus may further include a control part configured to selectively adjust the high frequency power applied to each of the first and second power supply electrodes.

BRIEF DESCRIPTION OF THE DRAWINGS

Exemplary embodiments can be understood in more detail from the following description taken in conjunction with the accompanying drawings, in which.

DETAILED DESCRIPTION OF EMBODIMENTS

Figure 1:
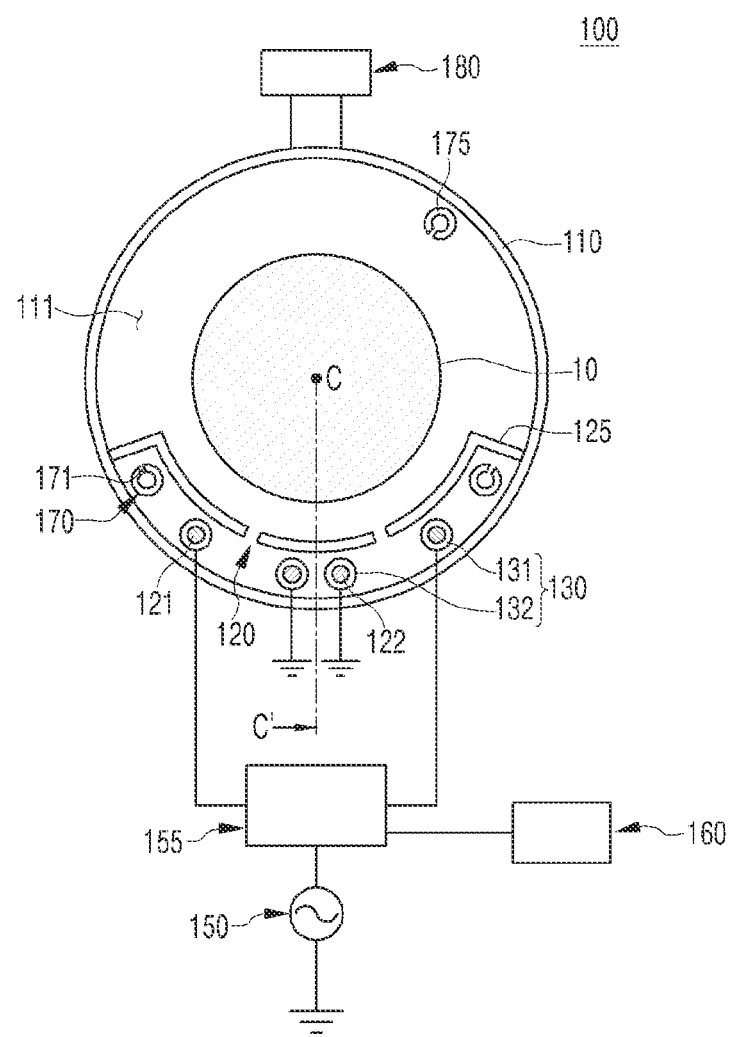
FIG. 1 is a schematic cross-sectional view of a batch type substrate processing apparatus in accordance with an exemplary embodiment.

Hereinafter, specific embodiments will be described in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. In the descriptions, the same elements are denoted with the same reference numerals. In the figures, the dimensions of layers and regions are exaggerated for clarity of illustration. Like reference numerals refer to like elements throughout.

FIG. 1 is a schematic cross-sectional view of a batch type substrate processing apparatus in accordance with an exemplary embodiment.

Referring to FIG. 1, a batch type substrate processing apparatus 100 in accordance with an exemplary embodiment may include a reaction tube 110 that provides a processing space 111, in which a plurality of substrates 10 are accommodated, a plurality of electrodes 121 and 122 extending in a longitudinal direction of the reaction tube 110 and disposed along a circumferential direction of the reaction tube 110, and an electrode protection part 130 that protects the plurality of electrodes 121 and 122.

The reaction tube 110 may have a cylindrical shape with a closed upper portion and an opened lower portion and made of a heat resistance material such as quartz or ceramic and may provide the processing space 111 in which the plurality of substrates 10 are accommodated to be processed. The processing space of the reaction tube 110 may be a space in which the substrate boat, on which the plurality of substrates 10 are loaded in the longitudinal direction of the reaction tube 110, are accommodated, and also, an actual processing process (for example, a deposition process) is performed.

Here, the substrate boat may be configured to support the substrates and be provided so that the plurality of substrates 10 are loaded in the longitudinal direction (i.e., a vertical direction) of the reaction tube 110 and also provide a plurality of processing spaces in which the plurality of substrates 10 are individually processed.

The plurality of electrodes 121 and 122 may extend along the longitudinal direction of the reaction tube 110 and may be disposed along the circumferential direction of the reaction tube 110. For example, each of the plurality of electrodes 121 and 122 may have a bar shape extending along the longitudinal direction of the reaction tube 110, may be arranged side by side (or parallel to each other), and may be disposed along the circumferential direction of the reaction tube 110.

Here, the plurality of electrodes 121 and 122 may include first and second power supply electrodes 121a and 121b spaced apart from each other, and first and second ground electrodes 122a and 122b provided between the first power supply electrode 121a and the second power supply electrode 121b to correspond to the first power supply electrode 121a and the second power supply electrode 121b, respectively. The first and second power supply electrodes 121a and 121b may be spaced apart from each other, and high frequency power (or RF power) may be supplied (or applied) to each of the first and second power supply electrodes 121a and 121b.

The first and second ground electrodes 122a and 122b may correspond to the first power supply electrode 121a and the second power supply electrode 121b, respectively, and be provided between the first power supply electrode 121a and the second power supply electrode 121b so as to be grounded. Here, the first and second ground electrodes 122a and 122b may be grounded respectively or may be grounded commonly. For example, the first and second ground electrodes 122a and 122b may be provided in a space in which the first power supply electrode 121a and the second power supply electrode 121b are provided to be spaced apart from each other. Here, the ground electrodes 122a and 122b corresponding to the first and second power supply electrodes 121a and 121b may be provided to face the first and second power supply electrodes 121a and 121b, respectively. As a result, the plasma may be generated between the power supply electrode 121 and the ground electrode 122, which correspond to each other so as to be paired.

When the high frequency power (or high frequency power) is supplied to the first and second power supply electrodes 121a and 121b, plasma may be generated between the first power supply electrode 121a and the first ground electrode 122a and between the second power supply electrode 121b and the second ground electrode 122b. That is, the first and second power supply electrodes 121a and 121b and the first and second ground electrodes 122a and 122b may have a four-electrode structure, and the high frequency power may be divided to be supplied to each of the first and second power supply electrodes 121a and 121b.

As a result, the high frequency power required for generating the plasma or the high frequency power for obtaining a desired amount of radicals may be reduced to prevent damage of the first and second power supply electrodes 121a and 121b and the first and second ground electrodes 122a and 122b and/or generation of particles due to the high frequency power from occurring.

In detail, as in the present disclosure, when the first and second power supply electrodes 121a and 121b and the first and second ground electrodes 122a and 122b have the four-electrode structure, plasma by which a process gas is decomposed may be generated, but the high frequency power required to generate or obtain a desired amount of radicals may be significantly reduced or may be reduced by half of the required high frequency power. Thus, the reaction tube 110 and the like (e.g., the reaction tube, the partition wall, the electrode protection part, etc.) by the high frequency power may be prevented from being damaged, and also, the particles may be prevented from being generated due to the damage of the reaction tube 110. For example, if the power required for decomposing the process gas with sufficient energy is approximately 100 W, when the four-electrode electrode in which the plurality of first and second ground electrodes 122a and 122b are disposed between the plurality of first and second power supply electrodes 121a and 121b is provided, power of approximately 50 W less than that of approximately 100 W may be supplied to each of the first and second power supply electrodes 121a and 121b. As a result, even though power loss than the power that is required to generate the plasma is supplied, the same amount of radicals as that when the power of approximately 100 W is supplied may be finally obtained. In addition, since low power of 50 W is supplied to each of the power supply electrodes 121, the process gas may be more effectively decomposed without generating the particles due to the high voltage.

Figure 2:
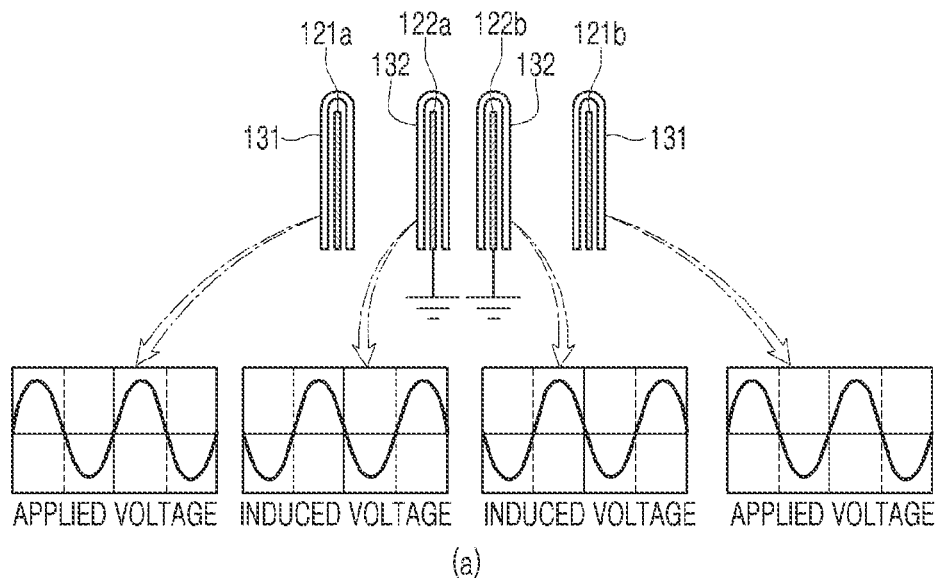
FIG. 2 is a conceptual view for explaining a voltage waveform induced into a ground electrode depending on the number of plurality of electrodes in accordance with an exemplary embodiment.
Figure 2:
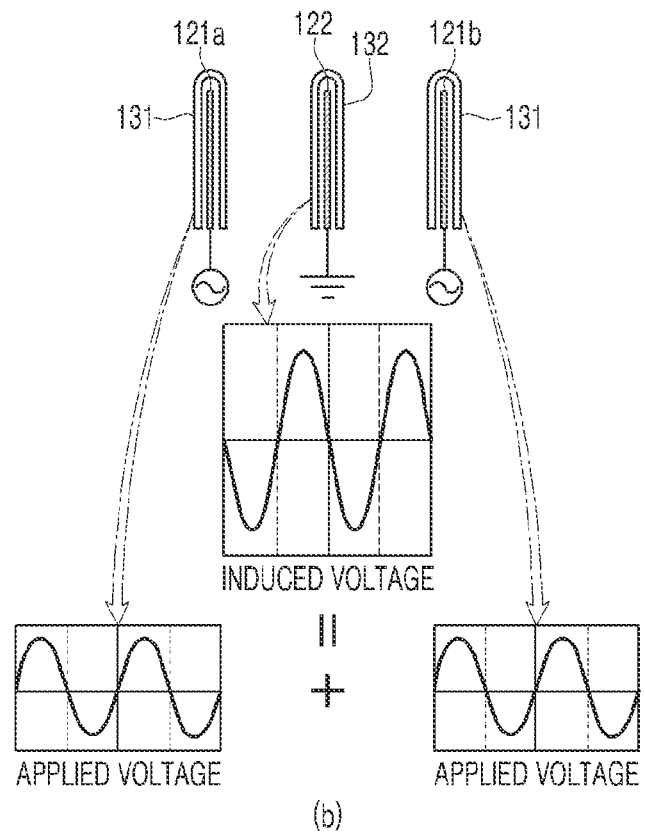

FIG. 2 is a conceptual view for explaining a voltage waveform induced into the ground electrode depending on the number of plurality of electrodes in accordance with an exemplary embodiment. Here, (a) of FIG. 2 illustrates the four-electrode structure, and (b) of FIG. 2 illustrates a three-electrode structure.

Referring to FIG. 2, it is seen that a voltage waveform induced into the ground electrode is different in the four-electrode structure of (a) of FIG. 2 and the three-electrode structure of (b) of FIG. 2.

In detail, in the three-electrode structure as illustrated in (b) of in FIG. 2, when the same high frequency power is simultaneously applied to the two power supply electrodes 121a and 121b, power applied to the first power supply electrode 121a and power applied to the second power supply electrode 121b may be combined (or merged), and thus, double voltage may be induced to the common ground electrode 122. That is, in the three-electrode structure using the common ground electrode 122, the voltage applied to the first power supply electrode 121a and the voltage applied to the second power supply electrode 121b have the same phase difference, and thus, electric fields greater than those of the two power supply electrodes 121a and 122b may be induced to the ground electrode 122. In addition, due to the undesired high electric fields, the plasma potential increases in proportion to the electric fields, and thus the plasma damage occurs. Particularly, the plasma damage may occur to damage the second electrode protection tube 132, the partition wall 125, the reaction tube 110, which are disposed around the ground electrode 122, to which the double voltage is induced.

On the other hand, as illustrated in (a) of FIG. 2, in the four-electrode structure in accordance with an exemplary embodiment, a voltage (i.e., the same voltage as that applied to each of the first power supply electrode and the second power supply electrode) corresponding to a half level of the voltage induced to the ground electrode 122 may be induced to the first and second ground electrodes 122a and 122b. Thus, the plasma damage occurring due to the high electric fields by the high voltage during plasma generation (turn on) and plasma maintenance may be suppressed or prevented. That is, the same voltage as the voltage applied to the first power supply electrode 121a may be induced to the first ground electrode 122a by the voltage applied to the first power supply electrode 121a. In addition, the same voltage as the voltage applied to the second power supply electrode 121b may be induced to the second ground electrode 122b by the voltage applied to the second power supply electrode 121b.

In addition, in the case of the three-electrode structure, the three electrodes may interfere with each other, but in the case of the four-electrode structure, the first power supply electrode 121a and the first ground electrode 122a may be paired, and the second power supply electrode 121b and the second ground electrode 122b may be paired, and thus, only electrodes corresponding to each other at a close distance may act on each other, but the electrodes, which do not correspond to each other at a long distance, may have little effect on each other. In addition, there may be little influence of interference between the power supply electrodes 121a and 121b and the ground electrodes 122b and 122a, which do not correspond to each other. For reference, in principle of electromagnetic fields and an electric circuit, the power supply electrode 121 acts with the closest ground electrode 122.

For example, the plurality of electrodes 121 and 122 may be disposed in a discharge space separated from the processing space 111 by a partition wall 125, and a plasma formation part 120 may be provided by the plurality of electrodes 121 and 122 and the partition wall 125. The plasma formation part 120 may generate plasma using the plurality of electrodes 121 and 122 and may decompose the process gas supplied from the gas supply tube 170 by the plasma to provide the decomposed process gas to the processing space 111 in the reaction tube 110. Here, the plasma formation part 120 may have the discharge space separated from the processing space 111 by the partition wall 125 extending in the longitudinal direction of the reaction tube 110. Here, the plasma may be generated in the discharge space by the plurality of electrodes 121 and 122 that extend along the longitudinal direction of the reaction tube 110 and are disposed in the circumferential direction of the reaction tube 110.

The discharge space of the plasma formation part 120 may be a space in which the plasma is generated and may be separated from the processing space 111 by the partition wall 125. Thus, the plasma formation part 120 may decompose the process gas supplied from the gas supply tube 170 using the plasma in the discharge space and may provide only radicals of the decomposed process gas into the processing space 111.

Here, the partition wall 125 may extend in the longitudinal direction of the reaction tube 110, be disposed inside the reaction tube 110, or be disposed outside the reaction tube 110. For example, the partition wall 125 may be disposed inside the reaction tube 110 to define the discharge space together with an inner wall of the reaction tube 110 as illustrated in FIG. 1, and may include a plurality of sub sidewalls connected to the inner wall (or inner surface) of the reaction tube 110 and a main sidewall between the plurality of sub sidewalls. The plurality of sub sidewalls may protrude (or extend) from the inner wall of the reaction tube 110 to the inside of the reaction tube 110 and may be spaced apart from each other to be disposed in parallel. In addition, the main sidewall may be spaced apart from the inner wall of the reaction tube 110 and disposed between the plurality of sub sidewalls. Here, all the plurality of sub sidewalls and the main sidewall may extend along the inner wall of the reaction tube 110 in the longitudinal direction of the reaction tube 110. However, the partition wall 125 may be provided in various shapes without being limited to the shape illustrated in FIG. 1 as long as the partition wall provides the discharge space that is separated from the processing process.

As another embodiment, the partition wall 125 may be disposed outside the reaction tube 110 to define the discharge space 125 together with an outer wall of the reaction tube 110 and may include the plurality of sub sidewalls connected to an outer surface (or outer wall) of the reaction tube 110 and the main sidewall between the plurality of sub sidewalls. The plurality of side sidewalls 115a and 115b may protrude from the outer wall of the reaction tube 110 to the outside of the reaction tube 110 and may be disposed to be spaced apart from each other and parallel to each other. In addition, the main sidewall may be spaced apart from the outer wall of the reaction tube 110 and disposed between the plurality of sub sidewalls.

The main sidewall may be provided in the form of a tube having a diameter less or greater than that of the reaction tube 110 to define the discharge space between the sidewall of the reaction tube 110 and the main sidewall (i.e., between the inner wall of the reaction tube and the main sidewall or between the outer wall of the reaction tube and the main sidewall).

The plasma formation part 120 may generate the plasma in the discharge space separated from the processing space 111 by the partition wall 125 so that the process gas supplied from the gas supply tube 170 is not directly supplied into the reaction tube 110 to be decomposed in the processing space 111, but is decomposed in the discharge space that is a space separated from the processing space 111 and then supplied into the processing space 111. The inner wall (or an inside wall) of the processing space 111 as well as the substrate 10 may increase in temperature by a hot wall type heating unit (or heater) surrounding the processing space 111, and thus, the process gas may be deposited to form an undesired thin film on the inner wall of the processing process 111. The thin film formed (or deposited) on the inner wall of the processing space 111 may act as a contaminant during the processing process of the substrate 10 while being separated as particles by an electric field or a magnetic field caused by the plasma. Thus, when the plasma formation part 120 generates the plasma in the discharge space that is separated from the processing space 111 through the partition wall 125 to directly supply the process gas into the processing space 111, thereby generating the plasma in the processing space 111, a limitation in which the thin film formed on the inner wall of the processing space 111 is separated as the particles by the electric field and magnetic field, may be prevented from occurring.

The electrode protection part 130 may protect the plurality of electrodes 121 and 122 and may surround at least a portion of each of the plurality of electrodes 121 and 122 to protect each of the plurality of electrodes 121 and 122. For example, the electrode protection part 130 may surround at least a portion of each of the first and second power supply electrodes 121a and 121b and the first and second ground electrodes 122a and 122b to protect the first and second power supply electrodes 121a and 121b and the first and second ground electrodes 122a and 122b.

Figure 3:
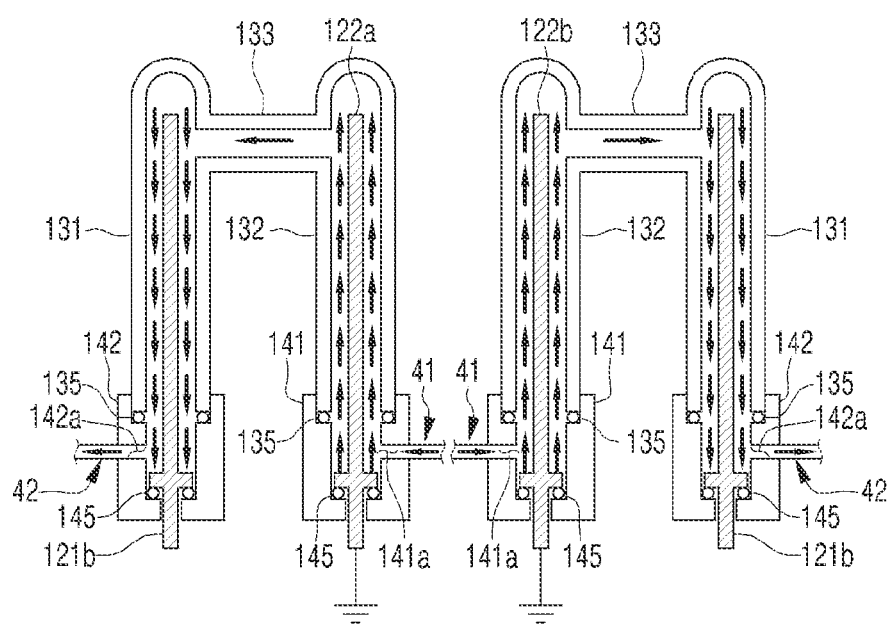
FIG. 3 is a conceptual view for explaining a flow of a cooling gas of an electrode protection part in accordance with an exemplary embodiment.

FIG. 3 is a conceptual view for explaining a flow of a cooling gas of the electrode protection part in accordance with an exemplary embodiment.

Referring to FIG. 3, the electrode protection part 130 may include a plurality of first electrode protection tubes 131, which have closed upper ends and opened lower ends and have inner spaces into which the first to second power supply electrodes 121a and 121b are inserted, respectively, a plurality of second electrode protection tubes 132, which have closed upper ends and opened lower ends and have inner spaces into which the first and second ground electrodes 122a and 122b are inserted, respectively, and a plurality of bridge parts 133 connecting upper ends of the first electrode protection tube 131 and the second electrode protection tube 132, which face each other, to each other, respectively. The plurality of first electrode protection tubes 131 may be provided in the first and second power supply electrodes 121a and 121b, respectively, and surround an outer circumferential surface of each of the first and second power supply electrodes 121a and 121b to protect the first and second power supply electrodes 121a and 121b. Here, the plurality of first electrode protection tubes 131 may have closed upper ends and opened lower ends and have internal spaces into which the first and second power supply electrodes 121a and 121b are inserted, respectively, so that each of the first and second power supply electrodes 121a and 121b is inserted upward through a lower opening. As a result, the plurality of first electrode protection tubes 131 may protect the first and second power supply electrodes 121a and 121b, respectively.

The plurality of second electrode protection tubes 132 may be provided in the first and second ground electrodes 122a and 122b, respectively, and surround an outer circumferential surface of each of the first and second ground electrodes 122a and 122b to protect the first and second ground electrodes 122a and 122b. Here, the plurality of second electrode protection tubes 132 may have closed upper ends and opened lower ends and have internal spaces into which the first and second ground electrodes 122a and 122b are inserted, respectively, so that each of the first and second ground electrodes 122a and 122b is inserted upward through the lower opening. As a result, the plurality of second electrode protection tubes 132 may protect the first and second ground electrodes 122a and 122b, respectively.

For example, each of the first and second power supply electrodes 121a and 121b and the first and second ground electrodes 122a and 122b may be protected to be surrounded by the first electrode protection tube 131 and/or the second electrode protection tube 132 from the top to the bottom, and each of the plurality of power supply electrodes 121a and 121b and the first and second ground electrodes 122a and 122b may be made of a flexible braided wire.

In general, electrical conduction due to the use of a high frequency power may cause a skin effect in which current flows along a surface (or may be affected by a skin depth of a metal, which is a depth through which current flows). In the case of using a mesh type electrode for the first and second power supply electrodes 121a and 121b and the first and second ground electrodes 122a and 122b, since an area occupied by an empty space is large, and thus, there is a limitation of inefficiency in supplying the high frequency power by large resistance due to the large surface area.

Furthermore, the processing process for the substrate 10 may be repeatedly performed at high and low temperatures, and when the first and second power supply electrodes 121*a* and 121*b* and the first and second ground electrodes 122*a* and 122*b* are provided in the mesh type, the shape of the mesh electrode may be irregularly changed according to the temperature, which is disadvantageous in terms of maintaining the shape. In addition, there is a limitation in that nonuniform plasma is generated when high frequency power is supplied because resistance varies in accordance with the changed shape.

In order to prevent these limitations, the first and second power supply electrodes 121*a* and 121*b* and the first and second ground electrodes 122*a* and 122*b* may be not only inserted into the first electrode protection tube 131 and/or the second electrode protection tube 132, but also minimize the empty space, and thus be provided in the braided type (braided wire) having flexibility. For example, in order to further reduce the empty space, a method of applying a metal on the surface of each of the electrodes may be additionally performed. In addition, a spring part (not shown) that fixes and supports both ends of each of the first and second power supply electrodes 121*a* and 121*b* and the ground electrode 122 so as not to move may be further provided so that the flexible braided type first and second power supply electrodes 121*a* and 121*b* and the first and second ground electrodes 122*a* and 122*b* extend in the longitudinal direction of the reaction tube 110 inside the discharge space and then are maintained in a fixed state. As a result, each of the first and second power supply electrodes 121*a* and 121*b* and the first and second ground electrodes 122*a* and 122*b*, which are flexible, may be fixed in the longitudinal direction of the reaction tube 110 by the spring part and then maintained in a thin and elongated rod shape.

The first electrode protection tube 131 and the second electrode protection tube 132 may surround the outside of the first and second power supply electrodes 121*a* and 121*b* and the outside of the first and second ground electrodes 122*a* and 122*b*, respectively, to electrically insulate each of the first and second power supply electrodes 121*a* and 121*b* and the first and second ground electrodes 122*a* and 122*b* and also protect the first and second power supply electrodes 121*a* and 121*b* and the first and second ground electrodes 122*a* and 122*b*, which are exposed to the plasma atmosphere, from the plasma. As a result, the first and second power supply electrodes 121*a* and 121*b* and the first and second ground electrodes 122*a* and 122*b* may be safely protected from the contamination or particles that may be generated by the plasma. Here, each of the first electrode protection tube 131 and the second electrode protection tube 132 may be made of a heat-resistant material such as quartz or ceramic and may be manufactured to be integrated with the reaction tube 110.

The plurality of bridge parts 133 may connect the first electrode protection tube 131 and the second electrode protection tube 132, which face each other (or are opposite to each other), to each other and may maintain a gap between the first electrode protection tube 131 and the second electrode protection tube 132. Thus, the distance between the power supply electrode 121 and the ground electrode 122 that interact with each other to generate plasma may be constantly maintained, and a pair of power supply electrode 121 and ground electrode 122, which correspond to each other, may have the same distance. Here, the first electrode protection tube 131 and the second electrode protection tube 132, which face each other, may refer to the electrode protection tubes 131 and 132, in which the first electrode protection tube 131 and the second electrode protection tube 132 interact with each other to generate plasma in a space therebetween are inserted, respectively. Here, the power supply electrode 121 may act with the nearest ground electrode 122 to generate the plasma in the space therebetween. In addition, the upper end refers to an upper (or top) portion including the upper end of the upper portion (or top) portion and also does not mean only the upper end. That is, the first electrode protection tube 131 and the second electrode protection tube 132 may be divided into the upper end, an intermediate end, and a lower end. Here, the lower end refers to a lower (or bottom) portion including the lower end of the lower (or bottom) portion, and the intermediate end refers to an intermediate portion between the upper end and the lower end.

In order to obtain the uniform plasma density in the discharge space, the spaced space between the power supply electrode 121 and the ground electrode 122 has to have the same volume (or area). In addition, it is necessary that the plasma (or plasma potential) having the same intensity may be generated in the space between the power supply electrode 121 and the ground electrode 122 to generate plasma having uniform density in the spaced space (or the plasma generation space) between the power supply electrode 121 and the ground electrode 122. For this, the first electrode protection tube 131 and the second electrode protection tube 132, which face each other, may be connected to each other through the bridge part 133 to maintain the distance between the first electrode protection tube 131 and the second electrode protection tube 132. Thus, the distance between the power supply electrode 121 and the ground electrode 122 that interacts with each other to generate plasma in the space therebetween, may be constantly maintained, and the spaced space between the power supply electrode 121 and the ground electrode 122 may have the same volume to generate the plasma having the uniform density in the plurality of plasma generation spaces.

For example, each of the first electrode protection tube 131 and the second electrode protection tube 132 may be elongated to support only the lower end (portion). In this case, the first electrode protection tube 131 and/or the second electrode protection tube 132 may be shaken or tilted. However, the bridge part 133 may connect the upper ends of the first electrode protection tube 131 and the second electrode protection tube 132 to each other to effectively prevent the first electrode protection tube 131 and/or the second electrode protection tube 132 from being shaken or tilted. That is, when the bridge part 133 connects only the intermediate ends and/or the lower ends to each other, the upper ends of the first electrode protection tube 131 and the second electrode protection tube 132, which are not connected to each other, may be shaken, bent, or tilted. However, the lower ends (portion) of the first electrode protection tube 131 and the second electrode protection tube 132 may be supported, and the upper ends of the first electrode protection tube 131 and the second electrode protection tube 132 may be connected and fixed to each other through the bridge part 133 to prevent the upper ends from being shaken, bent, and/or tilted, thereby preventing the first electrode protection tube 131 and the second electrode protection tube 132 from being shaken or tilted as a whole.

The first ground electrode 122*a* may be spaced apart from the first power supply electrode 121*a*, and the second ground electrode 122*b* may be spaced apart from the second power supply electrode 121*b*. The first ground electrode 122*a* may be provided spaced apart from the first power supply electrode 121*a*, and the first power supply electrode 121*a* and the first ground electrode 122a may be spaced apart from each other to provide a plasma generating space. In addition, the second ground electrode 122b may be provided to be spaced apart from the first power supply electrode 121a, and the first power supply electrode 121a and the first ground electrode 122a may be spaced apart from each other to provide a plasma generating space. As a result, the first and second power supply electrodes 121a and 121b and the first and second ground electrodes 122a and 122b may define the plurality of plasma generating spaces.

In addition, the plurality of electrodes 121 and 122 may generate capacitively coupled plasma (CCP) in the spaced space between the first power supply electrode 121a and the first ground electrode 122a and the spaced space between the second power supply electrode 121b and the second ground electrode 122b. That is, as the high frequency power is applied to each of the first and second power supply electrodes 121a and 121b, the capacitively coupled plasma (CCP) may be generated by electric fields generated in the spaced space between the power supply electrode 121 and the ground electrode 122, which face (correspond to) each other.

Here, unlike the capacitively coupled plasma (CCP) method in which plasma is generated by obtaining energy from electron acceleration generated by the electric fields generated in the space between the power supply electrode 121 and the ground electrode 122, which are spaced apart from (or separated from) each other, in an inductively coupled plasma (ICP) method, plasma is generated from electric fields generated around magnetic fields when the magnetic fields generated by electric current flowing through antennas connected to each other are changed with time. In general, in the inductively coupled plasma (ICP) method, the plasma is generated by an E-mode and converted to an H-mode to generate high-density plasma. The inductively coupled plasma (ICP) method is divided into the E-mode and the H-mode according to plasma density or applied power. In order to perform the mode conversion from the E-mode with low plasma density to the H-mode with high plasma density, high power has to be induced. In addition, when input power increases, a number of radicals that do not participate in the reaction in accordance with particles and a high electron temperature are generated to cause limitations, in which it difficult to obtain a good quality film, and it is difficult to generate uniform plasma in accordance with the electric fields generated by the antenna.

However, in the present disclosure, since the capacitively coupled plasma (CCP) is generated in each of the spaced spaces (i.e., the plasma generation spaces) between the power supply electrode 121 and the ground electrode 122, it may be difficult to induce high power for performing the mode conversion as in the inductively coupled plasma (ICP). As a result, it is more effective in preventing the generation of the particles and obtaining the good quality film by generating a large number of radicals participating in the reaction in accordance with the low electron temperature.

In addition, the first and second ground electrodes 122a and 122b may be spaced apart from each other and may be physically separated from each other. Here, the meaning of the 'spacing' or the 'separation' does not mean one body, and but means that a distance between each other is very narrow and greater than 0.

When the first and second ground electrodes 122a and 122b are attached to each other without being spaced apart from each other, the first and second ground electrodes 122a and 122b may interfere with each other, and the first and second ground electrodes 122a and 122b may interfere with the power supply electrodes 121b and 121a, which do not correspond thereto. For example, the voltage applied to the first power supply electrode 121a and the voltage applied to the second power supply electrode 121b may be combined in the first ground electrode 122a and the second ground electrode 122b (i.e., the first and second ground electrodes), and thus, almost double voltage may be induced to the first ground electrode 122a and the second ground electrode 122b. In this case, the plasma potential that is in proportion to the electric fields may increase due to the high electric fields, and thus, the plasma damage may occur to damage the second electrode protection tube 132, the partition wall 125, and the reaction tube 110, which are disposed around the first and second ground electrodes 122a and 122b, to which the double voltage is induced. Here, in the case of the four-electrode structure, since a total volume of the ground electrodes 122a and 122b increases compared to the case of the three-electrode structure, a lower voltage less than that in the three-electrode structure may be induced to the first and second ground electrodes 122a and 122b.

However, when the first and second ground electrodes 122a and 122b are spaced apart from each other, the interference between the first and second ground electrodes 122a and 122b may be suppressed or prevented, and the interference with the power supply electrodes 121b and 121a, which do not correspond to the first and second ground electrodes 122a and 122b, may be suppressed or prevented. That is, there is no interference between the first and second ground electrodes 122a and 122b, and there is no interference between the power supply electrodes 121b and 121a that do not correspond to the first and second ground electrodes 122a and 122b, and thus, the same voltage as that applied to the first power supply electrode 121a may be induced to only the first ground electrode 122a by the voltage applied to the first power supply electrode 121a. In addition, the same voltage as the voltage applied to the second power supply electrode 121b may be induced to only the second ground electrode 122b by the voltage applied to the second power supply electrode 121b. Thus, the plasma damage occurring due to the high electric fields by the high voltage during plasma generation and plasma maintenance may be suppressed or prevented.

Here, a spaced distance between the first and second ground electrodes 122a and 122b may be less than or equal to a spaced distance between the first power supply electrode 121a and the first ground electrode 122a and a spaced distance between the second power supply electrode 121b and the second ground electrode 122b. When the spaced distance between the first and second ground electrodes 122a and 122b is greater than the spaced distance between the first power supply electrode 121a and the first ground electrode 122a or the spaced distance between the second power supply electrode 121b and the second ground electrode 122b, a relatively low plasma density is formed in the space between the first and second ground electrodes 122a and 122b, and a plasma density and/or radical density in the discharge space is not uniform. For this reason, an amount of radicals supplied to each of the injection hole of the plasma formation part 120 may vary, and nonuniform processing (or deposition) may occur between the plurality of substrates 10. In addition, due to the structure of the batch type substrate processing apparatus 100, a width of the discharge space (or a width of the plasma formation part) is inevitably limited. As a result, when the spaced distance between the first and second ground electrodes 122a and 122b increases, the spaced space between the power supply electrode 121 and the ground electrode 122, which is the plasma generating space, is relatively reduced, and thus, the process gas may not be effectively decomposed, and the radicals may not effectively obtained.

Thus, the spaced distance between the first and second ground electrodes 122a and 122b may be less than or equal to the spaced distance between the power supply electrode 121 and the ground electrode 122, and thus, the process gas may be effectively decomposed to effectively obtain the radicals while preventing the interference between the first and second ground electrodes 122a and 122b and interference between the power supply electrodes 121a and 121b and the first and second ground electrodes 122a and 122b, which do not correspond to each other, from occurring. In addition, the plasma density and/or radical density within the discharge space may be uniformly generated. As a result, the non-uniform processing between the plurality of substrates 10 may be prevented to improve processing (or deposition) uniformity between the plurality of substrates 10.

Therefore, in the batch type substrate processing apparatus 100 in accordance with an exemplary embodiment, the first and second ground electrodes 122 may be provided between the first and second power supply electrodes 121a and 121b, which are spaced apart from each other, to provide the ground electrodes 122a and 122b, which correspond to the first and second power supply electrodes 121a and 121b, and thus, the ground electrode 122 may be commonly used to prevent the double electric fields from being induced into the ground electrode 122. Therefore, the plasma damage generated due to the plasma potential, which increases in proportion to the electric fields, may be suppressed or prevented, and thus, the lifespan of the plasma formation part may extend. In addition, a sputtering effect may be reduced by using the first and second power supply electrodes 121a and 121b to lower the applied voltage, and the process time may be shortened by using the high plasma density and radicals.

The first electrode protection tube 131 and the second electrode protection tube 132, which face each other, may be connected to each other by the bridge part 133 to communicate with each other. That is, the bridge part 133 may connect the first electrode protection tube 131 and the second electrode protection tube 132, which face each other, to each other, as well as allow the first electrode protection tube 131 and the second electrode protection tube 132 to communicate with each other so that a gas flows between the first electrode protection tube 131 and the second electrode protection tube 132. For example, a gas passage, in which inner walls (or inner surfaces) of the first electrode protection tube 131 and the second electrode protection tube 132 are respectively spaced apart from the power supply electrode 121 and the ground electrode 122 (or surfaces of the power supply electrode and the ground electrode) so that a gas flows, may be provided in each of the first electrode protection tube 131 and the second electrode protection tube 132. Here, a gas passage having a tube shape may be provided in the bridge part 133 to allow the gas passage of the first electrode protection tube 131 and the gas passage of the second electrode protection tube 131, which are connected to each other by the bridge part 133, to communicate with each other.

In addition, the batch type substrate processing apparatus 100 in accordance with an exemplary embodiment may further include a cooling gas supply part 41 that supplies a cooling gas into the first electrode protection tubes 131 and the second electrode protection tube 132, which face each other, and a cooling gas discharge part 42 that discharges the cooling gas from the first electrode protection tube 131 and the second electrode protection tube 132, which face each other, to generate a flow of the cooling gas.

The cooling gas supply part 41 may supply the cooling gas to the first electrode protection tube 131 and the second electrode protection tube 132, which face each other, to cool the power supply electrode 121 and the ground electrode 122, which are disposed in the first electrode protection tube 131 and the second electrode protection tube 132, which face each other, respectively. Heat may be generated while the plasma is generated by supplying the high frequency power to the first and second power supply electrodes 121a and 121b. A temperature rise of the first and second power supply electrodes 121a and 121b and the first and second ground electrodes 122a and 122b due to the heat generation causes an increase in (metal) resistance between the first and second power supply electrodes 121a and 121b and the first and second ground electrodes 122a and 122b. As a result, energy of ions generated by the plasma may increase while the (induced) voltage increases by Equation: voltage (V)=current (I)×resistance (R). Here, the ions having high energy may strongly collide with the surfaces of the plurality of first electrode protection tubes 131 and/or the second electrode protection tube 132 to cause damage of the plurality of first electrode protection tubes 131 and the second electrode protection tube 132 and/or generate particles such as metal components contained in a material that forms the first electrode protection tube 131 and the second electrode protection tube 132, such as quartz. The Particles generated as described above may act as contaminants in the reaction tube 110 to cause (metal) contamination of the thin film. For example, the contaminant particles (or particles) generated during a process of manufacturing a semiconductor device are very closely related to yield of the device, and in particular, the (metal) contamination particles generated during the thin film process conduct current to cause current leakage. Due to the current leakage, a malfunction of the device may be caused, and a fatal adverse effect may be exerted on the yield of the product.

Thus, in the present disclosure, the cooling gas may be supplied into the plurality of first electrode protection tubes 131 and the plurality of second electrode protection tubes 132 through the cooling gas supply part 41 to cool the first and second power supply electrodes 121a and 121b and the first and second ground electrodes 122a and 122b, thereby preventing or suppressing the increase in temperature of each of the first and second power supply electrodes 121a and 121b and the first and second ground electrodes 122a and 122b. Thus, the energy of the ions generated by the plasma may be prevented from increasing, and the plurality of first electrode protection tubes 131 and/or the second electrode protection tubes 132 may be prevented from colliding with each other on the surfaces of the plurality of electrode protection tubes 131 and/or the second electrode protection tube 132 due to the high level energy of the ions to exclude the effect of the (metal) contamination.

In addition, the process of processing the substrate 10 may be performed at a high temperature of approximately 600° C. or more, and the first and second power supply electrodes 121a and 121b and the first and second ground electrodes 122a and 122b, each of which is made of a metal such as nickel (Ni), may be oxidized at a high temperature of approximately 600° C. or more. Thus, the cooling gas may be supplied as a protective gas into the plurality of first electrode protection tubes 131 and the plurality of second electrode protection tubes 132 through the cooling gas supply part 41 to prevent the first and second power supply electrodes 121a and 121b and the first and second ground electrodes 122a and 122b from being oxidized, thereby improving the lifespan of the first and second power supply electrodes 121a and 121b and the first and second ground electrodes 122a and 122b.

For example, the cooling gas may be supplied to either electrode protection tube 131 or 132 of the first electrode protection tube 131 and the second electrode protection tube 132, which face each other, and then may flow into the other electrode protection tube 132 or 131 via the bridge part 133 (or through the bridge part). Here, the cooling gas may be supplied to (either) the same electrode of the first electrode protection tube 131 and the second electrode protection tube 132 in all of two pairs of the first electrode protection tube 131 and two pairs of the second electrode protection tube 132, which face each other. Alternatively, the cooling gas may be supplied to all the first electrode protection tubes 131 or supplied to all the second electrode protection tubes 132. Here, the cooling gas supply part 41 may include a flowmeter (not shown) that measures a flow rate (or supply amount) of the cooling gas. Thus, the flow rate of the cooling gas may be measured through the flowmeter (not shown) to adjust the supply amount (or flow rate) of the cooling gas. Here, the cooling gas supply part 41 may supply approximately 1.5 L or more of the cooling gas, and may supply the cooling gas at a flow rate of approximately 1.5 slm (standard liter per minute) or more.

The cooling gas discharge part 42 may discharge the cooling gas from the first electrode protection tubes 131 and the second electrode protection tube 132, which face each other, to generate a flow of the cooling gas. For example, the cooling gas supply part 41 may be connected to any one electrode protection tubes 131 and 132 of the first electrode protection tube 131 and the second electrode protection tube 132, which face each other, and the cooling gas discharge part 42 may be connected to the remaining (or the other) electrode protection tube 132 or 131, to which the cooling gas supply part 41 is not connected, of the first electrode protection tube 131 and the second electrode protection tube 132, which face each other. That is, the cooling gas discharge part 42 may be connected to the remaining electrode protection tube 132 or 131 to discharge the cooling gas supplied to any one electrode protection tubes 131 and 132 and discharge the cooling gas supplied to any one electrode protection tubes 131 and 132 to flow into the remaining electrode protection tube 132 or 131 through the bridge part 133.

In the present disclosure, a passage for the cooling gas, which passes through one electrode protection tube 131 or 132, the bridge part 133, and the other electrode protection tube 132 or 131 through the cooling gas supply part 41, the bridge part 133, and the cooling gas discharge part 42, may be provided. Thus, the cooling gas may effectively flow into the first electrode protection tube 131 and the second electrode protection tube 132, which face each other to effectively cool the first and second power supply electrodes 121a and 121b and the first and second ground electrodes 122a and 122b and effectively prevent the first and second power supply electrodes 121a and 121b and the first and second ground electrodes 122a and 122b from being oxidized.

In the three-electrode structure in accordance with the related art, when the plurality of first electrode protection tubes 131 and the second electrode protection tubes 132 are connected to each other by the bridge part 133, a flow rate of the cooling gas flowing through each of the plurality of first electrode protection tubes 131 and a flow rate of the cooling gas flowing through the second electrode protection tube 132 may be different from each other. Due to the above-described different flow rates, the flow of the cooling gas may not be smooth, and the power supply electrode 121 and the ground electrode 122 may not be effectively prevented from being oxidized. In addition, the different flow rates of the cooling gas in the first electrode protection tube 131 and the second electrode protection tube 132 may affect plasma formation, and effective decomposition of the process gas may not be achieved.

However, in this embodiment, since each of the bridge parts 133 connects one first electrode protection tube 131 to one second electrode protection tube 132, the cooling gas supply part 41 may be connected to one electrode protection tube 131 or 132, and the cooling gas discharge part 42 may be connected to the other electrode protection tube 132 or 131 so that the flow of the cooling gas passing through one electrode protection tube 131 or 132, the bridge part 133, and the other electrode protection tube 132 or 131 is smooth. Thus, the oxidation of the power supply electrode 121 and the ground electrode 122 may be effectively prevented, and the cooling gas may not affect the plasma formation, and thus, the process gas may be effectively decomposed.

Here, the cooling gas supply part 41 may be connected to each of the plurality of second electrode protection tubes 132, and the cooling gas discharge part 42 may be connected to the plurality of first electrode protection tubes 131. The cooling gas supply part 41 may be connected to each of the plurality of second electrode protection tubes 132 to firstly supply the cold cooling gas to each of the plurality of second electrode protection tubes 132 in which each of the first and second ground electrodes 122a and 122b is disposed (or inserted), thereby effectively cooling the first and second ground electrodes 122 through the cooling gas that is in a cold state because of passing through the other electrode protection tube (i.e., the first electrode protection tube).

Since the spaced distance between the first ground electrode 122a and the second ground electrode 122b is small and close to each other, heat generated from each of the first and second ground electrodes 122a and 122b may interfere by thermal radiation and/or convection. As a result, a heat generation temperature of the first and second ground electrodes 122a and 122b may be relatively higher than that of the first power supply electrode 121a and/or the second power supply electrode 121b, and the cooling of the first and second ground electrodes 122a and 122b may be less effective than that of the first power supply electrode 121a and/or the second power supply electrode 121b through the cooling gas having the same temperature.

Thus, the cold cooling gas may be firstly supplied to each of the plurality of second electrode protection tubes 132 in which the first and second ground electrodes 122a and 122b are respectively disposed, and in the state in which the cooling gas is cold, the first and second electrode protection tubes 132 may be in contact with the second ground electrodes 122a and 122b, respectively, and thus, a large temperature difference may occur between each of the first and second ground electrodes 122a and 122b and the cooling gas so as to be actively (or effectively) heat-exchanged between each of the first and second ground electrodes 122a and 122b and the cooling gas. Thus, the first and second ground electrodes 122a and 122b, which have a relatively high heat generation temperature or are poorly cooled, may be effectively cooled.

On the other hand, the cooling gas supply part 41 may be connected to each of the plurality of first electrode protection tubes 131 so that the cooling gas is heat-exchanged with each of the first and second power supply electrodes 121*a* and 121*b* while the cooling gas passes through the first electrode protection tube 131 when the cooling gas is supplied from each of the first electrode protection tubes 131 in which the first and second power supply electrodes 121*a* and 121*b* are disposed, respectively. As a result, the temperature difference between the heated cooling gas and the first and second ground electrodes 122*a* and 122*b* becomes insignificant (or reduced), resulting in a relatively high heat generation temperature or poor cooling of the first and second grounds so that the cooling of the first and second ground electrodes 122*a* and 122*b* is insignificant (or ineffective).

The cooling gas discharge part 42 may be connected to each of the plurality of first electrode protection tubes 131, and also, the cooling gas supplied to each of the plurality of second electrode protection tubes 132 to cool each of the first and second ground electrodes 122*a* and 122*b* may flow (or introduced) to the first electrode protection tube 131 through the (plurality of) bridge parts 133, and after cooling the first and second power supply electrodes 121*a* and 121*b* with the cooling gas introduced into each of the plurality of first electrode protection tubes 131, the cooling gas may be discharged. Thus, the cooling gas may be supplied to the second electrode protection tube 132 of the first electrode protection tube 131 and the second electrode protection tube 132, which face each other, through the cooling gas supply part 41 to pass through (each) the bridge part 133, thereby forming a flow of the cooling gas discharged to the cooling gas discharge part 42 after passing through the first electrode protection tube 131 of the first electrode protection tube 131 and the second electrode protection tube 132, which face each other.

Here, the cooling gas supplied to the second electrode protection tube 132 of the first electrode protection tube 131 and the second electrode protection tube 132, which face each other, may have a relatively high heat generation temperature or may not be cooled well so that the cooling gas moves to the first electrode protection tube 131 through the bridge part 133 after cooling the ground electrode 122. Here, even if the cooling gas is heated by the heat exchange with the ground electrode 122, the cooling gas may have a temperature lower than the temperature of the power supply electrode 121 to cool the power supply electrode 121. Here, each of the first and second power supply electrodes 121*a* and 121*b* may have a heat generation temperature less than that of each of the first and second ground electrodes 122*a* and 122*b*. As a result, the first and second power supply electrodes 121*a* and 121*b* may be sufficiently cooled even with the cooling gas heated by the heat exchange with each of the first and second ground electrodes 122*a* and 122*b*.

Here, the cooling gas discharge part 42 may include an exhaust line connected to each of the plurality of first electrode protection tubes 131. The exhaust line may be connected to each of the plurality of first electrode protection tubes 131. Thus, the cooling gas supplied to each of the plurality of second electrode protection tubes 132 to cool each of the first and second ground electrodes 122 and moving to the first electrode protection tube 131 through the bridge part 133 to cool the first power supply electrode 121*a* or the second power supply electrode 121*b* may be discharged. Here, a place (e.g., an exhaust port) at which the exhaust line is connected so that the cooling gas is discharged may be wider (or larger) than a place (e.g., an inflow port) at which the cooling gas is supplied. Thus, the cooling gas may be smoothly discharged, and thus, the cooling gas may flow smoothly according to the supply of the cooling gas.

In addition, the exhaust line may include a first exhaust line connected to a pumping port and a second exhaust line branching from the first exhaust line. The first exhaust line may be connected to the pumping port to generate an exhaust pressure (or a pressure for the exhaust) in at least a portion (e.g., the first exhaust line) of the exhaust line, and thus, the cooling gas may be smoothly discharged from the plurality of first electrode protection tubes 131.

For example, the first exhaust line may be connected to a vacuum pump connected to the pumping port, and the cooling gas heated by the heat exchange with each of the ground electrode 122 and the power supply electrode 121 may be quickly discharged. As a result, each of the ground electrode 122 and the power supply electrode 121 may be quickly cooled to improve cooling efficiency of each of the ground electrode 122 and the power supply electrode 121.

The second exhaust line may be branched from the first exhaust line, and the cooling gas may be exhausted to an atmosphere without forming an artificial exhaust pressure through a vacuum pump or the like.

Here, the cooling gas discharge part 42 may further include a diameter adjusting member (not shown) for adjusting an inner diameter of the exhaust line. The diameter adjusting member (not shown) may adjust an inner diameter of the exhaust line or may adjust an inner diameter of at least the first exhaust line. Since each of the plurality of first electrode protection tubes 131 and the plurality of second electrode protection tubes 132 is made of quartz or the like and thus broken by a vacuum pressure (or negative pressure), the inside of each of the plurality of first electrode protection tubes 131 and the plurality of second electrode protection tubes 132 may be maintained at an appropriate (internal) pressure (e.g., atmospheric pressure level). When an exhaust pressure is generated in the exhaust line through the vacuum pump without the diameter adjusting member (not shown), a too low (internal) pressure (or vacuum pressure) may be generated in the plurality of first electrode protection tubes 131 and the plurality of second electrode protection tubes 132, and thus, the plurality of first electrode protection tubes 131 and/or the plurality of second electrode protection tubes 132 may be broken. Thus, even if the inner diameter of at least the first exhaust line of the exhaust lines is reduced (or adjusted) through the diameter adjusting member (not shown) to generate the exhaust pressure in the exhaust line through the vacuum pump, the inside of the plurality of first electrode protection tubes 131 and the plurality of second electrode protection tubes 132 may be maintained at an appropriate (internal) pressure.

For example, the diameter adjusting member (not shown) may include an orifice, and the orifice having approximately ¼ inch (in) may be inserted into the first exhaust line so that the cooling gas that cools each of the ground electrode 122 and the power supply electrode 121 is constantly discharged to the vacuum pump. Here, the orifice may be provided as a punched thin plate and may be used for the purpose of pressure drop and flow restriction to help the discharge of the cooling gas at a stable exhaust pressure.

In addition, the batch type substrate processing apparatus 100 in accordance with the present disclosure may further include a needle valve (not shown) installed in the exhaust line to control a discharge amount of cooling gas that cools each of the ground electrode 122 and the power supply electrode 121. The needle valve (not shown) may be installed in the exhaust line to finely adjust the flow rate.

Here, the needle valve (not shown) may manually control an ultra-fine flow rate, and thus, the exhaust amount may be adjusted for vacuum exhaust and/or air exhaust (or heat exhaust).

Here, the cooling gas discharge part 42 may further include a first valve (not shown) provided in the first exhaust line, and a second valve (not shown) provided in the second exhaust line. The first valve (not shown) may be provided in the first exhaust line, and when the first valve (not shown) is opened, the exhaust through the first exhaust line may be performed, and thus, the vacuum exhaust may be performed.

The second valve (not shown) may be provided in the second exhaust line, and when the second valve (not shown) is opened, the exhaust through the second exhaust line may be performed, and the atmospheric exhaust may be performed.

For example, the first valve (not shown) and the second valve (not shown) may be provided (or installed) behind (or at a rear end) of a joining point between the exhaust line connected to the first electrode protection tube 131, in which the first power supply electrode 121a is disposed, and the exhaust line connected to the first electrode protection tube 131, in which the second power supply electrode 12b is disposed. As a result, the vacuum exhaust and the atmospheric exhaust may be diverged at the joining point according to the opening and closing of the first valve (not shown) and the second valve (not shown).

Here, the first valve (not shown) may be opened when the power is supplied to the first and second power supply electrodes 121a and 121b, and the second valve (not shown) may be opened when the power is not supplied to the first and second power supply electrodes 121a and 121b. That is, when (high frequency) power is supplied to the first and second power supply electrodes 121a and 121b to generate the plasma, since the first and second power supply electrodes 121a and 121b and the first and second ground electrodes 122a and 122b generate heat, the first valve (not shown) may be opened to rapidly cool each of the ground electrode 122 and the power supply electrode 121 through the formation of the exhaust pressure in the exhaust line, thereby improving the cooling efficiency of the first and second ground electrodes 122a and 122b and the first and second power supply electrodes 121a and 121b. On the other hand, when the power is not supplied to the first and second power supply electrodes 121a and 121b because the plasma generation is not required, the second valve (not shown) may be opened to exhaust the cooling gas, which is heated by the heat exchange with the ground electrode 122 and the first power supply electrode 121a or the second power supply tube 121b, to the atmosphere. Here, when the first valve (not shown) is opened, the second valve (not shown) may be closed, and when the second valve (not shown) is opened, the first valve (not shown) may be closed.

The exhaust line may generate an exhaust pressure of approximately 0.15 mbar or more per standard liter per minute (slm) of a flow rate of the cooling gas, and specifically, an exhaust pressure of approximately 0.15 to approximately 20 mbar or more per 1 slm of a flow rate of the cooling gas. A distance between each electrode 121 or 122 and the electrode protection tube 131 or 132 is not constant due to sagging (tilting) of the first power supply electrode 121a, the second power supply electrode 121b, the first ground electrode 122a, or the second ground electrode 122b to interrupt the flow of the cooling gas and acts as a factor that deteriorates the cooling efficiency of the first and second power supply electrodes 121a and 121b and/or the first and second ground electrodes 122a and 122b.

Thus, the exhaust line may generate an exhaust pressure of approximately 0.15 mbar or more per flow rate of approximately 1 slm of the cooling gas. In this case, the sagging of the first power supply electrode 121a, the second power supply electrode 121b, the first ground electrode 122a, or the second ground electrode 122b may be suppressed or prevented to uniformly maintain the distance between each electrode 121 or 122 and each the electrode protection tube 131 or 132. In addition, even if the distance between each electrode 121 or 122 and each electrode protection tube 131 or 132 is not constant, the cooling gas may flow at a (almost) constant (or equal) flow rate through each of the first electrode protection tube 131 and the second electrode protection tube 132, and thus, the cooling efficiency of the first and second power supply electrodes 121a and 121b and the first and second ground electrodes 122a and 122b may be uniform.

Here, when an exhaust pressure exceeding approximately 20 mbar per flow rate approximately 1 slm of the cooling gas is generated in the exhaust line, the cooling gas may flow too fast, and thus, the heat exchange with the first power supply electrode 121a and the second power supply electrode 121b, the first ground electrode 122a, and/or the second ground electrode 122b may not sufficiently performed. Thus, the cooling efficiency of the first and second power supply electrodes 121a and 121b and/or the first and second ground electrodes 122a and 122b may be deteriorated.

In addition, the exhaust pressure of each of the exhaust line connected to the first electrode protection tube 131, in which the first power supply electrode 121a is disposed, and the exhaust line connected to the first electrode protection tube 131, in which the second power supply electrode 121b may be adjusted (controlled). The exhaust pressure of each of the exhaust line connected to the first electrode protection tube 131, in which the first power supply electrode 121a is disposed, and the exhaust line connected to the first electrode protection tube 131, in which the second power supply electrode 121b may be adjusted, and thus, the cooling gas having a (almost) constant flow rate may flow into the plurality of first electrode protection tubes 131 and the plurality of second electrode protection tubes 131. Here, a flow rate of each of the plurality of first electrode protection tubes 131 may be measured to adjust the exhaust pressure of each of the exhaust line connected to the first electrode protection tube 131, in which the first power supply electrode 121a is disposed, and the exhaust line connected to the first electrode protection tube 131, in which the second power supply electrode 121b. In addition, the exhaust pressure of each of the exhaust line connected to the plurality of first electrode protection tubes 131 and the plurality of second electrode protection tubes 132, in which the first power supply electrode 121a is disposed, and the exhaust line connected to the first electrode protection tube 131 and the plurality of second electrode protection tubes 132, in which the second power supply electrode 121b may be adjusted so that the flow rate of each of the plurality of first electrode protection tubes 131 varies for appropriate cooling in accordance with the temperature of each of the first and second power supply electrodes 121a and 121b.

Each of the plurality of bridge parts 133 may have an inner diameter less than that of each of the plurality of first electrode protection tubes 131 and the plurality of second electrode protection tubes 132. When each of the plurality of bridge parts 133 has an inner diameter less than that of the plurality of first electrode protection tubes 131 and the plurality of second electrode protection tubes 132, after the cooling gas is sufficiently filled in each of the second electrode protection tube 132, the cooling gas may be distributed to flow to each of the first electrode protection tubes 131, and since the cooling gas is sufficiently filled in each of the second electrode protection tubes 132, each of the ground electrodes 122 may be effectively prevented from oxidized.

On the other hand, when each of the plurality of bridge parts 133 has an inner diameter equal to or larger than that of the plurality of first electrode protection tubes 131 and/or the plurality of second electrode protection tubes 132, the cooling gas supplied into the second electrode protection tube 132 may flow out to the plurality of bridge parts 133 before being (sufficiently) filled in the second electrode protection tube 132, and since the cooling gas is not provided to the entire surface of the first power supply electrode 121a, the second power supply electrode 121b, the first ground electrode 122a, and/or the second ground electrode 122b, the anti-oxidation effect may be reduced. In addition, the cooling efficiency may be deteriorated due to a portion at which the heat exchange is not performed, as well as, temperature non-uniformity may occur in the first power supply electrode 121a, the second power supply electrode 121b, the first ground electrode 122a and/or the second ground electrode 122b to damage the first power supply electrode 121a, the second power supply electrode 121b, the first ground electrode 122a, and/or the second ground electrode 122b or affect performance of the plasma discharge (or generation).

Thus, in the present disclosure, the limitations may be solved by making the inner diameter of each of the plurality of bridge part 133, which is less than the inner diameter of each of the plurality of first electrode protection tubes 131 and the plurality of second electrode protection tubes 132.

Here, the cooling gas may include an inert gas, and the inert gas may be nitrogen ($N_2$), argon (Ar), or the like. An inert gas such as nitrogen ($N_2$) may be supplied into the plurality of first electrode protection tubes 131 and the plurality of second electrode protection tubes 132 to prevent oxygen ($O_2$) from being introduced or staying in the plurality of first electrode protection tubes 131 and the plurality of second electrode protection tubes 132 and prevent the first and second power supply electrodes 121a and 121b and the first and second ground electrodes 122a and 122b from being oxidized by reacting with the oxygen ($O_2$).

When the power is not supplied to the first and second power supply electrodes 121a and 121b, the cooling gas supply part 41 may supply the cooling gas, which has a flow rate less than that when the power is supplied to the first and second power supply electrodes 121a and 121b. The first and second power supply electrodes 121a and 121b and the first and second ground electrodes 122a and 122b may generate the heat only when the plasma is generated by supplying the power to the first and second power supply electrodes 121a and 121b. As a result, when the power is not supplied to the first and second power supply electrodes 121a and 121b because the plasma is not generated (or discharged), the cooling gas having a flow rate (e.g., approximately 3 slm) less than that (e.g., approximately 10 slm) when the power is supplied to the first and second power supply electrodes 121a and 121b may be supplied and also be discharged through the general atmospheric exhaust to save energy consumption.

The batch type substrate processing apparatus 100 in accordance with the present disclosure may further include a gas supply sealing cap 141 which is connected to one electrode protection tube 132 or 131 of the first electrode protection tube 131 and the second electrode protection tube 132, which face each other, and in which an inflow port 141a through which the cooling gas is supplied is provided in a sidewall of an inner space communicating with the one electrode protection tube 132 or 131, and a gas discharge sealing cap 142 which is connected to the other electrode protection tube 131 or 132 of the first electrode protection tube 131 and the second electrode protection tube 132, which face each other, and in which an exhaust port 142a through which the cooling gas is discharged is provided in a sidewall of an inner space communicating with the other electrode protection tube 131 or 132.

The gas supply sealing cap 141 may be connected to any one electrode protection tube 132 or 131 of the first electrode protection tube 131 and the second electrode protection tube 132, which face each other, and may have an inner space communicating with the any one electrode protection tube 132 or 131 so that at least a portion of the electrode 122 or 121 inserted into the any one electrode protection tube 132 or 131 is inserted (or accommodated). In addition, the gas supply sealing cap 141 may be provided with the inflow port 141a, through which the cooling gas is supplied in a radial direction, is provided in the sidewall of the inner space communicating with the second electrode protection tube 132. That is, the inflow port 141a may be provided in a direction perpendicular to an extension direction of the electrode 122 or 121 inserted into the any one electrode protection tube 132 or 131.

For example, the gas supply sealing cap 141 may be connected to a lower end of the any one electrode protection tube 132 or 131, and a first sealing member 135 such as an O-ring may be interposed between the any one electrode protection tube 132 or 131 and the gas supply sealing cap 141. In addition, the lower end (or rear end) of the electrode 122 or 121 inserted into the any one electrode protection tube 132 or 131 may be drawn out through the gas supply sealing cap 141, and the electrode 122 or 121 inserted into the any one electrode protection tube 132 or 131 may be provided with a protrusion that is wider than that of the other portion accommodated in the inner space of the gas supply sealing cap 141 and be hung on a stepped portion of the lower end (e.g., the rear end) of the gas supply sealing cap 141. Here, the protrusion may be provided so that the electrode 122 or 121 itself inserted into the any one electrode protection tube 132 or 131 protrudes or may be provided by adding the same material or a different material on the electrode 122 or 121 inserted into the any one electrode protection tube 132 or 131. Here, a second sealing member 145 such as an O-ring may be interposed between the protrusion of the electrode 122 or 121 inserted into the any one electrode protection tube 132 or 131 and the stepped portion of the lower end of the gas supply sealing cap 141. Thus, the electrode 122 or 121 inserted into the any one electrode protection tube 132 or 131 may be stably supported to prevent or suppress the sagging phenomenon of the electrode 122 or 121 inserted into the any one electrode protection tube 132 or 131 from occurring, and the lower end of the any one electrode protection tube 132 or 131 may be sealed.

The gas discharge sealing cap 142 may be connected to the other electrode protection tube 131 or 132 of the first electrode protection tube 131 and the second electrode protection tube 132, which face each other, and may have an inner space communicating with the other electrode protection tube 131 or 132 so that at least a portion of the electrode 121 or 122 inserted into the other electrode protection tube 131 or 132 is inserted (or accommodated). In addition, the gas discharge sealing cap 142 may be provided with the exhaust port 142a, through which the cooling gas is supplied in the radial direction, in the sidewall of the inner space communicating with the second electrode protection tube 132. That is, the exhaust port 142a may be formed in a direction perpendicular to the extension direction of the electrode 121 or 122 inserted into the other electrode protection tube 131 or 132.

For example, the gas discharge sealing cap 142 may be connected to the lower end of the other electrode protection tube 131 or 132, and the first sealing member 135 may be interposed between the other electrode protection tube 131 or 132 and the gas discharge sealing cap 142. The lower end of the electrode 121 or 122 inserted into the other electrode protection tube 131 or 132 may be drawn out through the gas discharge sealing cap 142, and the electrode 121 or 122 inserted into the other electrode protection tube 132 or 131 may be provided with a protrusion that is wider than that of the other portion accommodated in the inner space of the gas discharge sealing cap 142 and be hung on a stepped portion of the lower end of the gas discharge sealing cap 142. Here, the protrusion may be provided so that the electrode 121 or 122 itself inserted into the other electrode protection tube 132 or 131 protrudes or may be provided by adding the same material or a different material on the electrode 121 or 122 inserted into the other electrode protection tube 131 or 132. Here, a second sealing member 145 may be interposed between the protrusion of the electrode 121 or 122 inserted into the other electrode protection tube 132 or 131 and the stepped portion of the lower end of the gas discharge sealing cap 142. Thus, the electrode 121 or 122 inserted into the other electrode protection tube 132 or 131 may be stably supported to prevent or suppress the sagging phenomenon of the electrode 121 or 122 inserted into the other electrode protection tube 132 or 131 from occurring, and the lower end of the other electrode protection tube 132 or 131 may be sealed.

The cooling gas may be supplied toward the side surface of the electrode 122 or 121 inserted into the any one electrode protection tube 132 or 131 through the inflow port 141a defined in the direction perpendicular to the extension direction of the electrode 122 or 121 inserted into the any one electrode protrusion tube 132 or 131, and thus, the cooling gas may be rapidly and effectively diffused along the side of the electrode 122 or 121 inserted into the any one electrode protection tube 132 or 131. In addition, the cooling gas may flow in contact with the surface of the electrode 122 or 121 inserted into the any one electrode protection tube 132 or 131, and the heat exchange between the electrode 122 or 121 inserted into any one electrode protection tube 132 or 131 and the cooling gas may be effectively performed. In addition, the cooling gas may effectively and quickly flow along the side surface of the electrode 121 or 122 inserted into the other electrode protection tube 131 or 131 through the exhaust port 142a provided in the direction perpendicular to the extension direction of the electrode 121 or 122 inserted into the other electrode protection tube 131 and 132, and thus, the electrode 121 or 122 inserted into the other electrode protection tube 131 or 132 as the cooling gas may flow in contact with the surface of the electrode 121 or 122 inserted into the other electrode protection tube 131 or 132 to effectively perform the heat exchange between the other electrode protection tube 131 or 132 and the cooling gas.

In addition, the inflow port 141a of the gas supply sealing cap 141 and the exhaust port 142a of the gas discharge sealing cap 142 may have different (extension) directions, (formation) positions, sizes (or diameters) and/or numbers.

For example, the inflow port 141a of the gas supply sealing cap 141 and the exhaust port 142a of the gas discharge sealing cap 142 may be symmetrically provided in opposite (extending) directions, so that the flow of the cooling gas is smooth as illustrated in FIG. 3.

In addition, the inflow port 141a of the gas supply sealing cap 141 and the exhaust port 142a of the gas discharge sealing cap 142 may be symmetrical to each other and be provided (or disposed) at opposite sides. For example, the inflow port 141a of the gas supply sealing cap 141 may be disposed at the opposite side of the side facing the gas discharge sealing cap 142 (or the side at which one electrode protection tube faces the other electrode protection tube). In addition, the exhaust port 142a of the gas discharge sealing cap 142 may be disposed at the opposite side of the side facing the gas supply sealing cap 141 (or the side at which the other electrode protection tube faces the one electrode protection tube).

When the inflow port 141a of the gas supply sealing cap 141 is disposed at the side facing the gas discharge sealing cap 142 (or the side at which one of the electrode protection tubes is connected to the bridge part), the cooling gas may flow along the side facing the inflow port 141a of the gas supply sealing cap 141 of the electrode 122 or 121 inserted into the any one electrode protection tube 132 or 131 so as to be discharged to the bridge part 133, and thus, the opposite side of the side facing the inflow port 141a of the gas supply sealing cap 141 of the electrode 122 or 121 inserted into the any one electrode protection tube 132 or 131 may not be cooled well. In addition, when the exhaust port 142a of the gas discharge sealing cap 142 is disposed at the side facing the gas supply sealing cap 141 (or the side at which the other electrode protection tube is connected to the bridge part), the bridge part 133), the cooling gas may flow along the side facing the exhaust port 142a of the gas discharge sealing cap 142 of the electrode 121 or 122 inserted into the other electrode protection tube 131 or 132 so as to be discharged to the exhaust port 142a of the gas discharge sealing cap 142, and thus, the opposite side of the side facing the exhaust port 142a of the gas discharge sealing cap 142 of the electrode 121 or 122 inserted into the other electrode protection tube 131 or 132 may not be cooled well.

However, when the inflow port 141a of the gas supply sealing cap 141 is disposed at the opposite side of the side facing the gas discharge sealing cap 142, and the exhaust port 142a of the gas discharge sealing cap 142 is disposed at the opposite side of the side facing the gas supply sealing cap 141, the electrode 122 or 121 inserted into the any one electrode protection tube 132 or 131 and the entirety of the electrodes 121 or 122 inserted into the other electrode protection tube 131 or 132 may be effectively cooled.

In addition, the gas discharge sealing cap 142 may be provided with the exhaust port 142a that has a size and/or number greater than that of the inflow port 141a of the gas supply sealing cap 141 so that the cooling gas is effectively discharged through the exhaust port 142a of the gas discharge sealing cap 142 to generate the smooth flow of the cooling gas.

Here, when the cooling gas supply part 41 is connected to each of the plurality of second electrode protection tubes 132, and the cooling gas discharge part 42 is connected to each of the plurality of first electrode protection tubes 131, the gas supply sealing cap 141 may be connected (or provided) to each of the plurality of second electrode protection tubes 132, and the gas discharge sealing cap 142 may be connected to each of the plurality of first electrode protection tubes 131.

In addition, each of the gas supply sealing cap 141, the gas discharge sealing cap 142, the first sealing member 135, and the second sealing member 145 may be made of a flame retardant material to eliminate deformation due to heat.

The batch type substrate processing apparatus 100 in accordance with an exemplary embodiment may further include a high frequency power source part 150 that supplies high frequency power and a power distribution part 155 disposed between the high frequency power source part 150 and the first and second power supply electrodes 121a and 121b to distribute the high frequency power supplied from the high frequency power source part 150, thereby providing the distributed high frequency power to each of the first and second power supply electrodes 121a and 121b.

The high frequency power source part 150 may supply high frequency power, and the supplied high frequency power may be applied (or supplied) to the first and second power supply electrodes 121a and 121b. When the high frequency power is applied to the power supply electrode 121, electric fields (or magnetic fields) may be generated between the power supply electrode 121 and the ground electrode 122, and thus, capacitively coupled plasma (CCP) may be generated by the generated electric fields.

When the high frequency power is applied to each of the first and second power supply electrodes 121a and 121b (for example, the four-electrode structure in which the first and second ground electrodes are disposed between the first and second power supply electrodes), the high frequency power may be divided and supplied to the first and second power supply electrodes 121a and 121b. Thus, power required to form (or generate) plasma or the power to obtain a desired amount of radicals may be reduced, and when compared to the case of applying a high frequency power to one power supply electrode 121, generation of particles may be reduced or prevented. In addition, since the plasma is generated in a larger (or wider) space (or area) than when the plasma is generated using one power supply electrode 121 and one ground electrode 122, the process gas may be decomposed more effectively.

For example, the high frequency power source part 150 may apply high frequency power having a frequency that is selected in range of approximately 4 MHz to approximately 40 MHz to each of the first and second power supply electrodes 121a and 121b. When the frequency of the high frequency power is greater than approximately 40 MHz, even in the case of the four-electrode structure having two power supply electrodes 121, an imaginary part Zn' of an overall impedance Zn is too low to cause a limitation in plasma ignition. On the other hand, when the frequency of the high frequency power is less than 4 MHz, since the imaginary part Zn' of the overall impedance Zn is too large, even if the number of power supply electrodes 121 increases, the minimum imaginary part Zn' of the overall impedance Zn' may not be achieved. That is, a circumference (length) of the reaction tube 110 is determined according to a size (or circumference) of the substrate 10, and the maximum number of power supply electrodes 121 is determined according to the circumference of the reaction tube 110. Thus, even if an imaginary part Zn' of the overall impedance Zn is reduced by increasing in number of power supply electrodes 121 in accordance with the limit to increase in number of power supply electrodes 121, the number of power supply electrodes 121 is not reduced up to a minimum imaginary part Zn' of the overall impedance Zn.

Thus, the high frequency power source part 150 may apply the high frequency power having a frequency that is selected in range of approximately 4 MHz to approximately 40 MHz to each of the plurality of power supply electrodes 121a and 121b. In addition, since the plasma generation space increases as the number of power supply electrodes 121 increases, the same (or a certain level) plasma density has to be provided in all the plasma generation spaces for the plasma uniformity in the discharge space. For this, the high frequency power having the same frequency (or an error range±10%) may be applied to each of the first and second power supply electrodes 121a and 121b.

For example, in the case of the four-electrode structure in which the first and second ground electrodes 122a and 122b are disposed between the first and second power supply electrodes 121a and 121b, the high frequency power having a frequency of about 27 MHz (or 27.12 MHz) may be applied to each of the first to second power supply electrodes 121a and 121b.

The power distribution part 155 may be provided between the high frequency power source part 150 and the first and second power supply electrodes 121a and 121b to distribute the high frequency power supplied from the high frequency power source part 150, thereby providing the distributed high frequency power to each of the first and second power supply electrodes 121a and 121b. Here, the power distribution part 155 may be a power splitter and be provided between the high frequency power supply part 150 and the first and second power supply electrodes 121a and 121b to distribute the high frequency power supplied (output) from the high frequency power supply part 150, and the distributed high frequency power may be provided to each of the first and second power supply electrodes 121a and 121b. In this case, since the same power (or voltage) is applied to each of the first and second power supply electrodes 121a and 121b, uniform plasma may be generated in the spaced space between the first power supply electrode 121a and the first ground electrode 122a and the spaced space between the second power supply electrode 121b and the second ground electrode 122b.

The high frequency power may be applied to each of the first and second power supply electrodes 121a and 121b through the plurality of high frequency power supply parts 150, but due to a performance difference between the plurality of high frequency power supply parts 150, different power may be applied to the first and second power supply electrodes 121a and 121b, respectively. Thus, the non-uniform plasma having different densities may be generated in the spaced space between the first power supply electrode 121a and the first ground electrode 122a and in the spaced space between the second power supply electrode 121b and the second ground electrode 122b. In addition, when the plasma is discharged by applying the high frequency power to each of the first and second power supply electrodes 121a and 121b through the plurality of high frequency power supply parts 150, all the plasma may be concentrated toward at the side at which the plasma is generated due to a low impedance of the high frequency power, and thus, the plasma may not be generated to be balanced with respect to the spaced space between the first power supply electrode 121a and the first ground electrode 122a and the spaced space between the second power supply electrode 121b and the second ground electrode 122b, and electrical damage may easily occur to the power supply electrode 121 and the ground electrode 122 that generate the plasma.

However, when the high frequency power supplied from one high frequency power supply part 150 is distributed through the power distribution part 155 and provided to each of the first and second power supply electrodes 121a and 121b, the same power may be applied to the first and second power supply electrodes 121a and 121b, and thus, the uniform plasma may be generated in the spaced space between the first power supply electrode 121a and the first ground electrode 122a and the spaced space between the second power supply electrode 121b and the second ground electrode 122b.

The plasma between the spaced space between the first power supply electrode 121a and the first ground electrode 122a and the spaced space between the second power supply electrode 121b and the second ground electrode 122b may be non-uniform due to various (external) factors, and the plasma densities between the spaced space between the first power supply electrode 121a and the first ground electrode 122a and the spaced space between the second power supply electrode 121b and the second ground electrode 122b may be non-uniform. Particularly, when at least one of the first and second power supply electrodes 121a and 121b is disposed outside the partition wall 125, the partition wall 125 may be disposed in the spaced space between the first power supply electrode 121a and the first ground electrode 122a and/or the spaced space between the second power supply electrode 121b and the second ground electrode 122b, and thus, the non-uniformity in plasma density between the spaced space between the first power supply electrode 121a and the first ground electrode 122a and the spaced space between the second power supply electrode 121b and the second ground electrode 122b may be further intensified due to the interference by the partition wall 125. In this case, the magnitude or ratio of the high frequency power provided to each of the first to second power supply electrodes 121a and 121b through the power distribution part 155 may be adjusted to be provided to each of the first and second power supply electrodes 121a and 121b. As a result, the uniform plasma may be generated in the spaced space between the first power supply electrode 121a and the first ground electrode 122a and between the second power supply electrode 121b and the second ground electrode 122b.

Also, when the plasma densities generated in the spaced space between the first power supply electrode 121a and the first ground electrode 122a and the spaced space between the second power supply electrode 121b and the second ground electrode 122b may be different from each other are not uniform (or are uniform), the high frequency power output from one high frequency power supply unit 150 may be equally distributed and supplied to each of the first to second power supply electrodes 121a and 121b. Here, the high frequency power source part 150 may supply RF power, which is in the form of a pulse, to the first and second power supply electrodes 121a and 121b and also may supply the RF power by adjusting a width and duty ratio of the pulse.

Here, the power distribution part 155 may include a variable capacitor (not shown) provided between a distribution point, at which the high frequency power is distributed to each of the first and second power supply electrodes 121a and 121b, and at least one of the first and second power supply electrodes 121a and 121b. The variable capacitor (not shown) may be provided between the distribution point, at which the high frequency power is distributed to each of the first and second power supply electrodes 121a and 121b and the at least one of the first and second power supply electrodes 121a and 121b, and the magnitude or ratio of the high frequency power supplied from the high frequency power source part 150 may be adjusted by changing the capacitance (or storage capacitance).

For example, one variable capacitor (not shown) may be provided in the power distribution part 155. Here, a fixed capacitor (not shown) may be provided between the distribution point and one power supply electrode 121a or 121b of the first to second power supply electrodes 121a and 121b, and the variable capacitor (not shown) may be provided between the distribution point and the other power supply electrode 121b or 121a of the first to second power supply electrodes 121a and 121b. As a result, the variable capacitor (not shown) may be adjusted in accordance with the plasma density generated in the spaced space between the one power supply electrode 121a or 121b and the one ground electrode 122a or 122b to adjust the plasma density generated in the spaced space between the other power supply electrode 121b or 121a and the ground electrode 122b or 122a. Here, the plasma density generated in the spaced space between the other power supply electrode 121b or 121a and the ground electrode 122b or 122a may be adjusted to be same as that generated in the spaced space between the one power supply electrode 121a or 121b and the ground electrode 122a or 122b.

The variable capacitor (not shown) may be provided in plurality, and the plurality of variable capacitors (not shown) may be disposed to correspond to the first and second power supply electrodes 121a and 121b, respectively, and the plurality of variable capacitors (not shown) may be connected (or provided) between the distribution point, at which the high frequency power supplied from the high frequency power supply 150 is distributed, and each of the first to second power supply electrodes 121a and 121b. Here, the plurality of variable capacitors (not shown) may adjust the magnitude or ratio of the high frequency power supplied from the electrically connected high frequency power source part 150.

In the present disclosure, the variable capacitor (not shown) may be installed at a rear end (or after) the distribution point so as to be provided between the distribution point and at least one of the first and second power supply electrodes 121a and 121b, thereby adjusting (regulating) the plasma density in the spaced space between the first power supply electrode 121a and the first ground electrode 122a and the spaced space between the second power supply electrode 121b and the second ground electrode 122b.

The batch type substrate processing apparatus 100 in accordance with an exemplary embodiment may further include a control part 160 for selectively adjusting the high frequency power applied to each of the first and second power supply electrodes 121a and 121b.

The control part 160 may selectively control the high frequency power applied to each of the first and second power supply electrodes 121a and 121b and may selectively adjust the high frequency power applied to each of the first and second power supply electrodes 121a and 121b in accordance with the plasma state such as discharge current, discharge voltage, and phase. Here, the control part 160 may be connected to the power distribution part 155 to control the variable capacitor 155a, thereby adjusting the intensity or ratio of the high frequency power applied to each of the plurality of power supply electrodes 121a and 121b.

For example, the batch type substrate processing apparatus 100 in accordance with an exemplary embodiment may further includes a plasma measuring part (not shown) that measures the plasma density of each of the spaced spaces between the first power supply electrode 121a and the first ground electrode 122 and between the second power supply electrode 121*b* and the second ground electrode 122*b*. The control part 160 may adjust the high frequency power applied to each of the first and second power supply electrodes 121*a* and 121*b* in accordance with the plasma density measured in the plasma measuring part (not shown).

The plasma measuring part (not shown) may measure the plasma density in each of the spaced space between the first power supply electrode 121*a* and the first ground electrode 122*a* and the spaced space between the second power supply electrode 121*b* and the second ground electrode 122*b* and also may measure the plasma density by measuring the discharge characteristic values such as the discharge current, the discharge voltage, and the phase. For example, the plasma measuring part (not shown) may include a probe rod. The probe rod may be provided in each of the spaced space between the first power supply electrode 121*a* and the first ground electrode 122*a* and the spaced space between the second power supply electrode 121*b* and the second ground electrode 122*b* to measure the discharge characteristic values of the plasma generated in the spaced space between the first power supply electrode 121*a* and the first ground electrode 122*a* and the spaced space between the second power supply electrode 121*b* and the second ground electrode 122*b*. As a result, the plasma measuring part (not shown) may measure the plasma density.

The control part 160 may receive the plasma density measured by the plasma measuring part (not shown) to adjust the high frequency power applied to each of the first and second power supply electrodes 121*a* and 121*b* in accordance with the measured plasma density. In addition, the control part 160 may be connected to the power distribution part 155 and may control the variable capacitor (not shown) to adjust the magnitude or ratio of the high frequency power applied to the first and second power supply electrodes 121*a* and 121*b*. For example, the probe rod may be provided in each of the spaced space between the first power supply electrode 121*a* and the first ground electrode 122*a* and the spaced space between the second power supply electrode 121*b* and the second ground electrode 122*b* to adjust the magnitude or ratio of the high frequency power through the variable capacitor (not shown). Here, the discharge characteristic values (e.g., the discharge current, the discharge voltage, the phase, etc.) of the plasma generated in the spaced space between the first power supply electrode 121*a* and the first ground electrode 122*a* and the spaced space between the second power supply electrode 121*b* and the second ground electrode 122*b* and/or the plasma density may be measured through the probe rod so that the magnitude or ratio of the high frequency power applied to each of the first and second power supply electrodes 121*a* and 121*b* is adjusted.

In this embodiment, the magnitude or ratio of the high frequency power applied to each of the first and second power supply electrodes 121*a* and 121*b* may be controlled so that deposition of the radicals required for the substrate processing process is uniform to be variably adjusted to solve the limitation in which the plasma density distribution is non-uniform.

The batch type substrate processing apparatus 100 in accordance with an exemplary embodiment may further include a gas supply tube 170 that supplies the process gas required a process of processing a plurality of substrates 10, and an exhaust part 180 that exhausts the inside of the reaction tube 110.

The gas supply tube 170 may supply the process gas that is necessary for the process of processing the plurality of substrates 10 and may supply the process gas into the reaction tube 110 through the plasma formation part 120. In addition, the gas supply tube 170 may include a discharge port 171 that discharges (or injects) the process gas into the discharge space. Here, the plasma formation part 120 may be arranged in the longitudinal direction of the reaction tube 110 and include a plurality of injection holes through which the radicals of the process gas decomposed by the plasma are supplied to the processing space 111. For example, the plurality of injection holes may be defined in the partition wall 125 and may supply radicals to the processing space 111.

Here, the gas supply tube 170 may be provided in plurality that are symmetrically disposed at both sides of a radial direction C-C' extending from a central axis C of the reaction tube 110 to a center of the discharge space. Here, the pair of the first power supply electrode 121*a* and the first ground electrode 122*a* and the pair of the second power supply electrode 121*b* and the second ground electrode 122*b* may also be symmetrically disposed at both sides in the radial direction C-C' extending toward the center of the discharge space. When the plurality of gas supply tubes 170 are symmetrically disposed in the radial direction C-C' extending to the center of the discharge space, the process gas may be uniformly supplied to both spaces (or regions) of the discharge space, and thus, the process gas may be effectively diffused within the discharge space. In addition, the pair of the first power supply electrode 121*a* and the first ground electrode 122*a* and the pair of the second power supply electrode 121*b* and the second ground electrode 122*b* may be symmetrically disposed at both sides in the radial direction C-C' extending from the central axis C, and thus, the process gas may be uniformly supplied to the spaced space between the first power supply electrode 121*a* and the first ground electrode 122*a* and the spaced space between the second power supply electrode 121*b* and the second ground electrode 122*b*. Thus, the plasma uniformity in the spaces at both the sides of the discharge space may be improved, and an amount of radicals supplied (or passing through) between the plurality of injection holes 123 defined in the plasma formation part 120 and supplying the radicals to the processing space may be uniform.

The exhaust part 180 may exhaust the inside of the reaction tube 110 and may be disposed to face the plasma formation part 120. The exhaust part 180 may be disposed in the processing space 111 to discharge the process residues in the processing space 111 to the outside. The exhaust part 180 may include an exhaust nozzle extending in the longitudinal direction (or vertical direction) of the reaction tube 110, an exhaust line connected to the exhaust nozzle, and an exhaust pump. The exhaust nozzle may face the injection hole of the plasma formation part 120 and may include a plurality of exhaust holes arranged in the vertical direction corresponding to the unit processing spaces of the substrate boat.

Thus, the injection hole of the plasma formation part 120 and the exhaust hole of the exhaust part 180 may correspond to each other and be disposed in the same line in the direction parallel to the surface of the substrate 10, which crosses the longitudinal direction of the reaction tube 110 on which the substrate 10 is loaded, and thus, the radicals injected from the injection hole may be introduced into the exhaust hole to generate a laminar flow. Thus, the radicals injected from the injection holes may be uniformly supplied to a top surface of the substrate 10

Here, the process gas may include one or more types of gases and may include a source gas and a reaction gas that reacts with the source gas to form a thin film material. For example, when the thin film material to be deposited on the substrate 10 is silicon nitride, the source gas may include a silicon-containing gas such as dichlorosilane ($SiH_2Cl_2$, abbreviation: DCS), and the reaction gas may include a nitrogen-containing gas such as $NH_3$, $N_2O$, No, and the like.

The batch type substrate processing apparatus 100 in accordance with an exemplary embodiment may further include a heating unit surrounding the reaction tube 110 to heat the plurality of substrates 10. In addition, the substrate boat may rotate by a rotating unit connected to a lower portion of the substrate boat for uniformity of the processing process.

In addition, the RF power may be supplied with RF power in a pulse form. The pulsed RF power may be adjusted in pulse width and duty ratio in a pulse frequency band of approximately 4 MHz to approximately 40 MHz (or approximately 1 kHz to approximately 10 kHz). The duty ratio means a ratio of an on-cycle and an off-cycle. When the pulsed RF power is applied to the first and second power supply electrodes 121a and 121b, the plasma may be periodically turned on/off, i.e., the plasma may be generated in the form of a pulse. As a result, the density of that ions that damage the first and second power supply electrodes 121a and 121b, the first and second ground electrodes 122a and 122b, and the partition wall 125 during the treatment process and generate the particles may be reduced, but the density of radicals may be constantly maintained. Thus, the damage of the first and second power supply electrodes 121a and 121b, the first and second ground electrodes 122a and 122b, and the partition wall 125 and the generation of the particles may be reduced or prevented while maintaining the efficiency of the treatment process.

As described above, in the exemplary embodiment, the plurality of electrodes exposed to the plasma atmosphere may be protected from the plasma while electrically insulating the plurality of electrodes through the electrode protection part, and the plurality of electrodes may be safely protected from the contamination or particles that may be generated by the plasma. In addition, the upper ends of the first electrode protection tube and the second electrode protection tube, which face each other, may be connected to each other through the plurality of bridge parts to constitute the electrode protection part, and thus, the distance between the first electrode protection tube and the second electrode protection tube, which face each other, may be constantly maintained so that the distance between the first power supply electrode and the first ground electrode and the distance between the second power supply electrode and the second ground electrode are uniformly maintained, and the spaced space between the first power supply electrode and the first ground electrode and the distance between the second power supply electrode and the second ground electrode may have the same volume. As a result, the plasma density may be uniform in the plurality of plasma generating spaces. In addition, the first electrode protection tube and the second electrode protection tube, which face each other, may communicate with each other through the bridge part to form the flow of the cooling gas through the cooling gas discharge part while supplying the cooling gas into the first electrode protection tube and the second electrode protection tube, which face each other, and thus, the first to second power supply electrodes and the first to second ground electrodes, which generate heat while generating the plasma, may be effectively cooled. In addition, the first and second ground electrodes may be provided between the first and second power supply electrodes, which are spaced apart from each other, to provide the first and second ground electrodes corresponding to the first and second power supply electrodes, respectively, and thus, the ground electrode may be commonly used to prevent the double electric field from being induced in the ground electrode, thereby suppressing or preventing the plasma damage occurring due to the plasma potential increasing in proportion to the electric field and extending in lifespan of the plurality of electrodes and the electrode protection part. The sputtering effect may be reduced by using the plurality of power supply electrodes to lower the applied voltage, and the process time may be shortened by using the high plasma density and radicals. In addition, the high frequency power supplied from one high frequency power supply part may be distributed through the power distribution part so as to be supplied to the first and second power supply electrodes, and thus, the uniform plasma may be formed in the spaced space between the first power supply electrode and the first ground electrode and the spaced space between the second power supply electrode and the second ground electrode.

The batch type substrate processing apparatus in accordance with the exemplary embodiment may electrically insulate the plurality of electrodes and simultaneously protect the plurality of electrodes, which are exposed to the plasma atmosphere, from the plasma through the electrode protection part and also safely protect the plurality of electrodes from the contamination or particles, which may occur by the plasma. In addition, the upper ends of the first electrode protection tube and the second electrode protection tube, which face each other, may be connected to each other through the plurality of bridge parts to constitute the electrode protection part, and thus, the distance between the first electrode protection tube and the second electrode protection tube, which face each other, may be constantly maintained to uniformly maintain the distance between the first power supply electrode and the first ground electrode and the distance between the second power supply electrode and the second ground electrode. Therefore, the spaced space between the first power supply electrode and the first ground electrode and the spaced space between the second power supply electrode and the second ground electrode may have the same volume so that the plasma density between the plurality of plasma generation spaces are uniform.

In addition, the first electrode protection tube and the second protection tube, which face each other, may communicate with each other through the bridge part to form the flow of the cooling gas through the cooling gas discharge part while supplying the cooling gas into the first electrode protection tube and the second electrode protection tube, which face each other, through the cooling gas supply part. Therefore, the first and second power supply electrodes, which generates the heat while generating the plasma, and the first and second ground electrodes may be effectively cooled.

In addition, the first and second ground electrodes may be provided between the first and second power supply electrodes spaced apart from each other to provide the first and second ground electrodes respectively corresponding to the first and second power supply electrodes, and thus, the ground electrode may be commonly used to prevent the double electric field from being induced in the ground electrode. Therefore, the plasma damage generated due to the plasma potential, which increases in proportion to the electric fields, may be suppressed or prevented, and thus, the lifespan of the plurality of electrodes and/or the electrode protection part may be extended. The sputtering effect may be reduced by using the first and second power supply electrodes to reduce the applied voltage, and the process time may be shortened by using the high plasma density and radicals.

In addition, the high frequency power supplied from one high frequency power supply part may be distributed through the power distribution part so as to be supplied to the first and second power supply electrodes, and thus, the uniform plasma may be formed in the spaced space between the first power supply electrode and the first ground electrode and the spaced space between the second power supply electrode and the second ground electrode.

Although embodiments have been described with reference to a number of illustrative embodiments thereof, the embodiments are not limited to the foregoing embodiments, and thus, it should be understood that numerous other modifications and embodiments can be devised by those skilled in the art that will fall within the spirit and scope of the principles of this disclosure. Hence, the real protective scope of the present invention shall be determined by the technical scope of the accompanying claims.

What is claimed is:

1. A batch type substrate processing apparatus comprising:
    a reaction tube configured to provide a processing space in which a plurality of substrates are accommodated;
    a plurality of electrodes extending in a longitudinal direction of the reaction tube and disposed along a circumferential direction of the reaction tube; and
    an electrode protection part configured to protect the plurality of electrodes,
    wherein the plurality of electrodes comprise:
        first and second power supply electrodes spaced apart from each other; and
        first and second ground electrodes provided between the first power supply electrode and the second power supply electrode to correspond to the first power supply electrode and the second power supply electrode, respectively, and
    the electrode protection part comprises:
        a plurality of first electrode protection tubes, each of which has a closed upper end and an opened lower end, and which have inner spaces in which the first and second power supply electrodes are inserted, respectively;
        a plurality of second electrode protection tubes, each of which has a closed upper end and an opened lower end, and which have inner spaces in which the first and second ground electrodes are inserted, respectively; and
        a plurality of bridge parts configured to connect upper ends of the first electrode protection tube and the second electrode protection tube, which face each other, to each other, respectively,
    wherein the first ground electrode is spaced apart from the first power supply electrode,
    the second ground electrode is spaced apart from the second power supply electrode,
    the first and second ground electrodes are spaced apart from each other, and
    a spaced distance between the first and second ground electrodes is less than or equal to each of a spaced distance between the first power supply electrode and the first ground electrode and a spaced distance between the second power supply electrode and the second ground electrode.

2. The batch type substrate processing apparatus of claim 1, wherein
    the plurality of electrodes are configured to generate capacitively coupled plasma (CCP) in a spaced space between the first power supply electrode and the first ground electrode and a spaced space between the second power supply electrode and the second ground electrode.

3. The batch type substrate processing apparatus of claim 1, wherein the first electrode protection tube and the second electrode protection tube, which face each other, are connected to each other by the bridge parts to communicate with each other,
    wherein the batch type substrate processing apparatus further comprises:
    a cooling gas supply part configured to supply a cooling gas into the first electrode protection tube and the second electrode protection tube, which face each other; and
    a cooling gas discharge part configured to discharge the cooling gas from the first electrode protection tube and the second electrode protection tube, which face each other, so as to generate a flow of the cooling gas.

4. The batch type substrate processing apparatus of claim 3, wherein the cooling gas supply part is connected to each of the plurality of second electrode protection tubes, and
    the cooling gas discharge part is connected to each of the plurality of first electrode protection tubes.

5. The batch type substrate processing apparatus of claim 3, further comprising:
    a gas supply sealing cap which is connected to any one electrode protection tube of the first electrode protection tube and the second electrode protection tube, which face each other, and in which an inflow port through which the cooling gas is supplied is provided in a sidewall of an inner space communicating with the any one electrode protection tube; and
    a gas discharge sealing cap which is connected to the other electrode protection tube of the first electrode protection tube and the second electrode protection tube, which face each other, and in which an exhaust port through which the cooling gas is discharged is provided in a sidewall of an inner space communicating with the other electrode protection tube.

6. The batch type substrate processing apparatus of claim 3, wherein the cooling gas comprises an inert gas.

7. The batch type substrate processing apparatus of claim 1, further comprising:
    a high frequency power source part configured to supply high frequency power; and
    a power distribution part provided between the high frequency power source part and the first and second power supply electrodes and configured to distribute the high frequency power supplied from the high frequency power source part so as to provide the distributed high frequency power to each of the first and second power supply electrodes.

8. The batch type substrate processing apparatus of claim 7, wherein the power distribution part comprises a variable capacitor provided between a distribution point, at which the high frequency power is distributed to each of the first and second power supply electrodes, and at least one of the first and second power supply electrodes.

9. The batch type substrate processing apparatus of claim 1, further comprising a control part configured to selectively adjust the high frequency power applied to each of the first and second power supply electrodes.

* * * * *